(12) United States Patent
Nakamura et al.

(10) Patent No.: US 10,923,414 B2
(45) Date of Patent: Feb. 16, 2021

(54) SEMICONDUCTOR DEVICE AND METHOD OF MANUFACTURING SEMICONDUCTOR DEVICE

(71) Applicant: Fuji Electric Co., Ltd., Kanagawa (JP)

(72) Inventors: Hideyo Nakamura, Nagano (JP); Tatsuo Nishizawa, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/269,258

(22) Filed: Feb. 6, 2019

(65) Prior Publication Data

US 2019/0287887 A1     Sep. 19, 2019

(30) Foreign Application Priority Data

Mar. 16, 2018 (JP) ................. 2018-049747

(51) Int. Cl.
  *H01L 23/49* (2006.01)
  *H01L 21/48* (2006.01)
  *H01L 23/498* (2006.01)
  *H01L 23/00* (2006.01)
  *H01L 25/07* (2006.01)

(52) U.S. Cl.
  CPC .... *H01L 23/49811* (2013.01); *H01L 21/4846* (2013.01); *H01L 23/49* (2013.01); *H01L 24/33* (2013.01); *H01L 24/83* (2013.01); *H01L 25/072* (2013.01); *H01L 2224/33181* (2013.01)

(58) Field of Classification Search
  CPC .......... H01L 23/49811; H01L 21/4846; H01L 23/49; H01L 24/33; H01L 24/83; H01L 25/072

USPC ........................................................ 257/786
See application file for complete search history.

(56) References Cited

U.S. PATENT DOCUMENTS

| | | | |
|---|---|---|---|
| 8,586,420 B2 | 11/2013 | Stolze et al. | |
| 2004/0195686 A1* | 10/2004 | Jobetto | H01L 21/568 257/734 |
| 2006/0044735 A1* | 3/2006 | Hayashi | H01L 23/49827 361/313 |
| 2006/0076677 A1* | 4/2006 | Daubenspeck | H01L 24/11 257/734 |
| 2006/0131730 A1* | 6/2006 | Nakamura | H01L 23/13 257/700 |
| 2007/0275503 A1* | 11/2007 | Lin | H01L 24/29 438/106 |

(Continued)

FOREIGN PATENT DOCUMENTS

| | | |
|---|---|---|
| JP | 2009-545180 A | 12/2009 |
| JP | 2010-165764 A | 7/2010 |

(Continued)

*Primary Examiner* — Sheikh Maruf
(74) *Attorney, Agent, or Firm* — Chen Yoshimura LLP

(57) ABSTRACT

A semiconductor device includes: an insulated circuit board including metal layers having recesses, and an insulating board having an upper surface on which the metal layers are arranged; external terminals having bottom ends with a width narrower than the width of openings of the recesses, these bottom ends being inserted into the recesses; a printed circuit board that directly supports the external terminals; and first bonding material that is arranged inside the recesses and respectively conductively connects the bottom ends of the external terminals to the metal layers.

19 Claims, 20 Drawing Sheets

(56) References Cited

U.S. PATENT DOCUMENTS

| | | | |
|---|---|---|---|
| 2008/0023829 A1 | 1/2008 | Kok et al. | |
| 2008/0050905 A1* | 2/2008 | Uchida | H01L 24/03 438/614 |
| 2009/0039498 A1* | 2/2009 | Bayerer | H01L 24/34 257/700 |
| 2009/0152741 A1* | 6/2009 | Chang | G02B 6/4214 257/778 |
| 2009/0227073 A1* | 9/2009 | Lee | H01L 21/4846 438/121 |
| 2010/0140803 A1* | 6/2010 | Sakamoto | H01L 21/568 257/762 |
| 2010/0187685 A1* | 7/2010 | Morifuji | H01L 24/17 257/737 |
| 2010/0244241 A1* | 9/2010 | Marimuthu | H01L 21/561 257/737 |
| 2010/0264549 A1* | 10/2010 | Ko | H01L 21/4846 257/774 |
| 2011/0140190 A1* | 6/2011 | Fumitake | H01L 21/28114 257/324 |
| 2011/0233766 A1* | 9/2011 | Lin | H01L 21/76877 257/737 |
| 2014/0021627 A1* | 1/2014 | Kimura | H01L 23/49541 257/773 |
| 2014/0048941 A1* | 2/2014 | Gatterbauer | H01L 24/06 257/762 |
| 2015/0223339 A1 | 8/2015 | Nakamura et al. | |
| 2015/0303164 A1* | 10/2015 | Chen | H01L 23/3735 361/720 |
| 2015/0371938 A1* | 12/2015 | Katkar | H01L 25/50 257/774 |
| 2015/0380374 A1* | 12/2015 | Nakamura | H01L 25/18 361/783 |
| 2016/0079133 A1* | 3/2016 | Nashida | H01L 25/18 257/690 |
| 2016/0181174 A1* | 6/2016 | Gambino | H01L 23/367 257/499 |
| 2017/0077068 A1* | 3/2017 | Horio | H01L 23/492 |
| 2017/0133309 A1* | 5/2017 | Kim | H01L 23/49816 |

FOREIGN PATENT DOCUMENTS

| | | |
|---|---|---|
| JP | 4570092 B2 | 10/2010 |
| JP | 2012-129336 A | 7/2012 |
| JP | 2013-102112 A | 5/2013 |
| JP | 2013-125804 A | 6/2013 |
| JP | 2016-154258 A | 8/2016 |
| WO | 2014/061211 A1 | 4/2014 |

* cited by examiner

SEMICONDUCTOR DEVICE AND METHOD OF MANUFACTURING SEMICONDUCTOR DEVICE

BACKGROUND OF THE INVENTION

Technical Field

The present invention relates to a semiconductor device and a method of manufacturing the semiconductor device.

Background Art

Patent Document 1 discloses, as a method of connecting external terminals and an insulated circuit board in a semiconductor device, a technology for directly bonding the bottom surfaces of the external terminals to the surface of a metal layer using a bonding material such as solder. Patent Document 2 discloses a technology for forming holes in an insulating layer other than the metal layer itself. Patent Documents 3, 4, and 5 respectively disclose technologies for forming recesses each having a portion with a width of less than the maximum diameter of external terminals in a metal layer and then pressing the external terminals into the formed recesses.

Moreover, Patent Document 6 discloses a free-standing structure in which holes having sidewalls with a stair-shaped cross-sectional shape are formed in a metal layer and external terminals having ends shaped so as to fit into the formed holes are fitted or pressed into the hole. Patent Document 7 discloses a free-standing structure in which external terminals having pointed ends or external terminals having stair-shaped sidewalls are inserted or pressed into holes formed in a metal layer.

Furthermore, Patent Document 8 discloses a technology for forming recesses in a metal layer and then lowering the bottom ends of external terminals into solder inside the recesses in order to form a connection. In addition, Patent Document 9 discloses a technology for forming through holes having a greater diameter than the diameter of external terminals in a printed circuit board, inserting the external terminals into the formed through holes, and forming a solder bond between the external terminals and the through holes in order to support the external terminals on the printed circuit board.

However, in Patent Document 1, primarily only the bottom surface of each external terminals is bonded to the metal layer, which results in extremely low bond strength. Attempting to form an additional fillet made of solder or the like around the outer peripheral surface of the bottom end of the external terminal in order to improve the bond strength increases the amount of solder required and can potentially enlarge the associated wetting and spreading region as well. Enlarging this wetting and spreading region can cause the solder to come into contact with other solder for bonding a nearby semiconductor chip, in which case the solder for bonding the semiconductor chip can flow into the solder for bonding the external terminals and cause the semiconductor chip to shift away from the intended position. Avoiding such displacement of the semiconductor chip requires allocating more area for the metal layer so as to allow the wetting and spreading region of the solder for bonding the external terminals to remain sufficiently separated from the solder for bonding the semiconductor chip; however, this can result in an undesirable increase in the overall size of the semiconductor device.

Moreover, in Patent Documents 2 to 7, the external terminals and the holes or recesses have to be reliably bonded together only by the fit therebetween. This requires use of high-precision machining processes to form the holes in the metal layer or to shape the ends of the external terminals, which increases manufacturing costs. Furthermore, forming the holes requires additional adjustments in order to avoid damaging any insulating boards beneath the metal layer, which also increases costs.

In addition, in Patent Document 8, although on the lower side a certain bond strength is achieved between the external terminals and the metal layer, on the upper side a gap exists between the printed circuit board and the external terminals, which reduces the overall bend strength of the semiconductor device. Moreover, in Patent Document 9, a separate process for providing solder between the external terminals and the printed circuit board is required, which increases the complexity of the assembling process. Furthermore, providing the solder directly between the bottom ends of the external terminals and the upper surface of the metal layer causes the solder to be more prone to spreading out, which increases the area that must be allocated for the solder and thereby increases the area of the overall semiconductor device.

RELATED ART DOCUMENTS

Patent Documents

Patent Document 1: Japanese Patent Application Laid-Open Publication No. 2013-125804

Patent Document 2: Japanese Translation of PCT International Application No. 2009-545180

Patent Document 3: Japanese Patent Application Laid-Open Publication No. 2013-102112

Patent Document 4: Japanese Patent Application Laid-Open Publication No. 2016-154258

Patent Document 5: WO 2014/061211

Patent Document 6: Japanese Patent No. 4570092

Patent Document 7: U.S. Pat. No. 8,586,420

Patent Document 8: Japanese Patent Application Laid-Open Publication No. 2012-129336

Patent Document 9: Japanese Patent Application Laid-Open Publication No. 2010-165764

SUMMARY OF THE INVENTION

The present invention was made in view of the problems described above and aims to provide a semiconductor device and a method of manufacturing the semiconductor device that offer increased bond strength between an insulated circuit board, external terminals, and a printed circuit board and also offer excellent manufacturability.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: an insulated circuit board that includes an insulating board having an upper surface and a metal layer on the upper surface of the insulating board, the metal layer having a recess in an upper surface thereof; a rod-shaped external terminal having a top end to be connected to an external device and a bottom end inserted into the recess in the metal layer of the insulated circuit, the bottom end having a width narrower than a width of an opening of the recess; a printed circuit board that directly supports the external terminal at an intermediate portion thereof between the top end and the bottom end so that the printed circuit board is disposed over the insulated circuit board in parallel with the insulated circuit board; and a first bonding material that is arranged inside the recess and conductively connects together the bottom end of the external terminal and the metal layer.

In another aspect, the present disclosure provides a method of manufacturing a semiconductor device, including: preparing a printed circuit board that directly supports a rod-shaped external terminal at an intermediate portion of the external terminal between a top end and a bottom end of the external terminal; preparing an insulated circuit board that includes an insulating board having an upper surface and a metal layer on the upper surface of the insulating board, the metal layer having a recess in an upper surface thereof, and an opening of the recess being larger than a width of the bottom end of the external terminal; putting a first bonding material inside the recess or on the bottom end of the external terminal; moving the printed circuit board towards the insulated circuit board so as to bring the bottom end of the external terminal inside the recess with the first bonding material being inside the recess; and liquefying the first bonding material in the recess to fix the bottom end of the external terminal to the recess via the first bonding material so that the printed circuit board is disposed over the insulated circuit board in parallel with the insulated circuit board.

The present invention makes it possible to provide a semiconductor device and a method of manufacturing the semiconductor device that offer increased bond strength between an insulated circuit board, external terminals, and a printed circuit board and also offer excellent manufacturability.

It is to be understood that both the foregoing general description and the following detailed description are exemplary and explanatory, and are intended to provide further explanation of the invention as claimed.

DETAILED DESCRIPTION OF EMBODIMENTS

Figure 1:
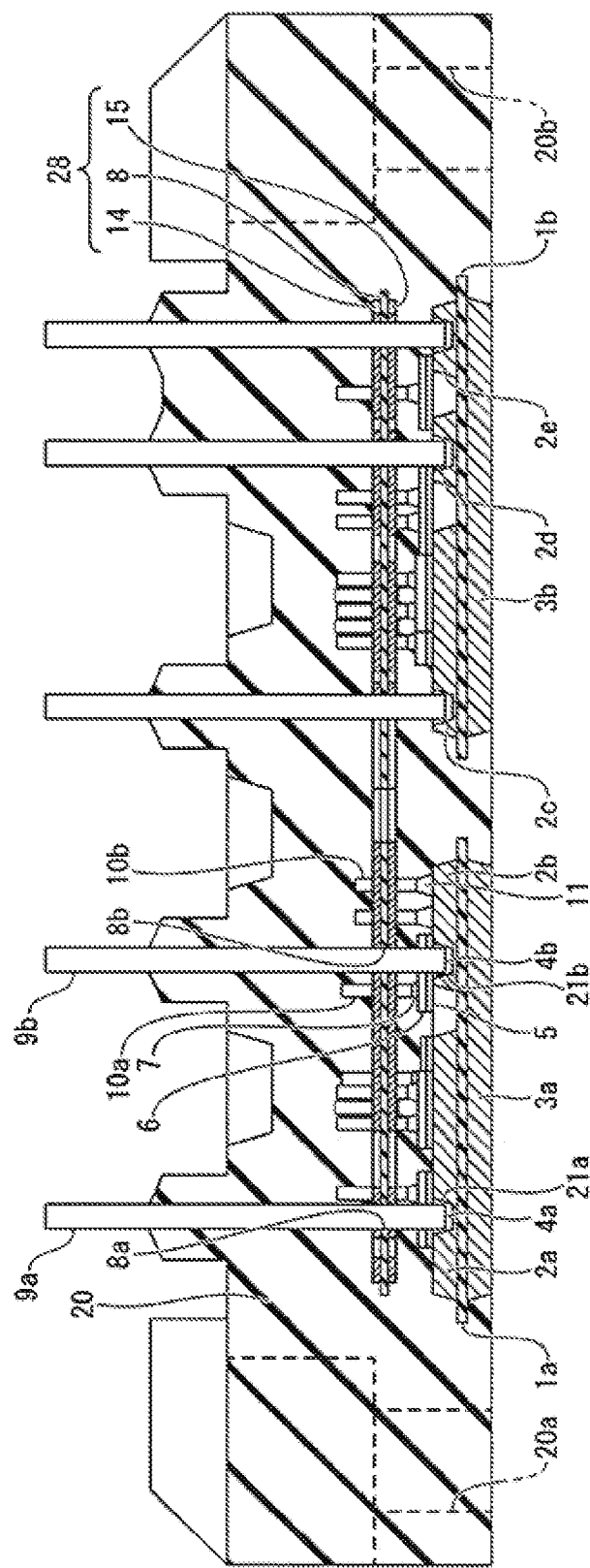
FIG. 1 is a cross-sectional view schematically illustrating a basic configuration of a semiconductor device according to an embodiment of the present invention.

Next, embodiments of the present invention will be described. In the following descriptions of the drawings, the same or similar reference characters will be used for components that are the same or similar. Note, however, that the drawings are only intended to be schematic illustrations, and the relationships between thickness and planar dimensions, the proportions between the thicknesses of each device and each component, and the like may be different from in the actual devices. Therefore, specific thicknesses and dimensions should be determined by referring to the descriptions below. Similarly, the illustrated dimensional relationships and proportions of components in the figures may differ from one drawing to the next. Moreover, in the following descriptions, the "left and right" and the "up and down" directions are defined only for the purposes of convenience and do not limit the technical concepts of the present invention in any way. Therefore, the drawings may be rotated by 90° such that the "left and right" and the "up and down" directions are interchanged, or the drawings may be rotated by 180° such that the "left" direction becomes the "right" direction and the "right" direction becomes the "left" direction, for example.

—Semiconductor Device—

As illustrated in FIG. 1, a semiconductor device according to an embodiment of the present invention is a so-called two-in-one power semiconductor device in which two semiconductor modules are connected in parallel in order to achieve greater capacity. The areas surrounding the two semiconductor modules that are connected in parallel are filled in with a resin, and this sealing resin 20 provides electrical insulation from the surrounding environment.

The left-side semiconductor module includes an insulated circuit board (1a, 2a, 2b, 3a) and a plurality of rod-shaped external terminals 9a and 9b formed standing on the insulated circuit board (1a, 2a, 2b, 3a). Similarly, the right-side semiconductor module includes an insulated circuit board (1b, 2c-2e, 3b) and a plurality of rod-shaped external terminals formed standing on the insulated circuit board (1b, 2c-2e, 3b). In the semiconductor device, a printed circuit board 28 (8, 14, 15) is arranged above the two insulated circuit boards (1a, 2a, 2b, 3a) and (1b, 2c-2e, 3b).

Figure 2:
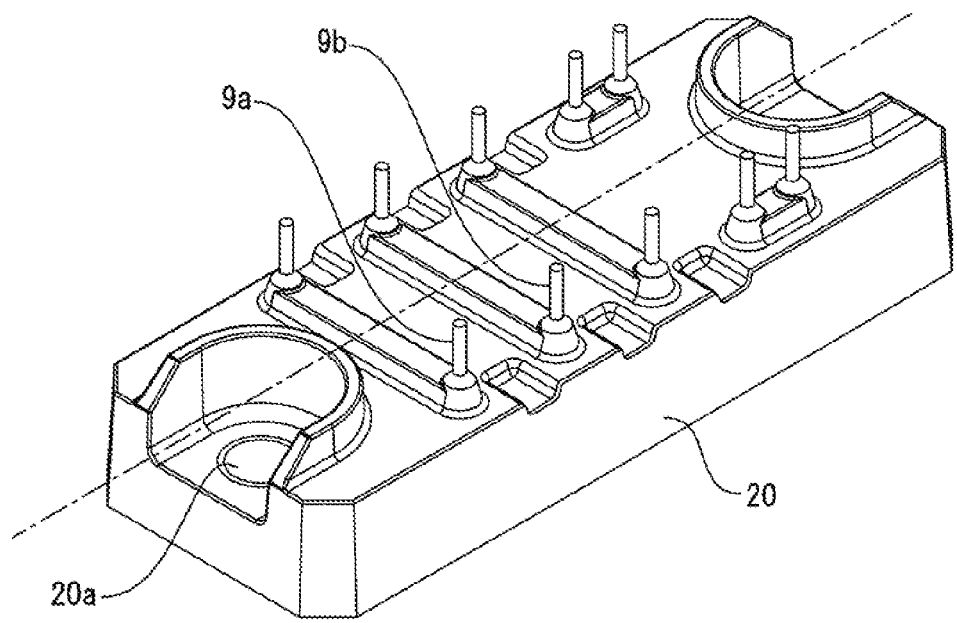
FIG. 2 is a perspective view (bird's eye view) schematically illustrating the basic configuration of the semiconductor device according to the embodiment of the present invention.

Meanwhile, as illustrated in FIG. 2, on the outside of the semiconductor device, the upper ends of the external terminals 9a and 9b protrude out from the sealing resin 20 so as to be partially exposed. The external terminals 9a and 9b carry output current or measurement current or the like that flows between the semiconductor device and external devices connected to the semiconductor device. When IGBTs are used as the semiconductor chips and these plurality of IGBTs are connected in series in the forward direction to form the semiconductor device, for example, the external terminal 9a can be used as an external terminal that is connected to a wire which connects the emitter electrode of one IGBT to the collector electrode of the other IGBT. Moreover, the external terminal 9b can be used as an emitter-side connection terminal that is electrically connected to the emitter electrode of the one IGBT. In FIG. 2, the external terminal positioned on the right side of the external terminal 9b and in line with the external terminal 9a and the external terminal 9b can be used as a collector-side connection terminal that is electrically connected to the collector electrode of the other IGBT. Furthermore, the two external terminals positioned on the right side and in line with the external terminal that is the collector-side connection terminal can respectively be used as a gate signal control terminal and an emitter signal terminal.

In FIG. 2, the ends of a total of ten external terminals are shown on the upper surface of the semiconductor device. On the right side of a center line of the semiconductor device (illustrated by the dash-dotted line), five external terminals that include the external terminal 9a and the external terminal 9b are arranged in a straight line. Meanwhile, on the left side of the center line, another five terminals are arranged in a straight line so as to respectively form pairs with the five external terminals on the right side.

Figure 3:
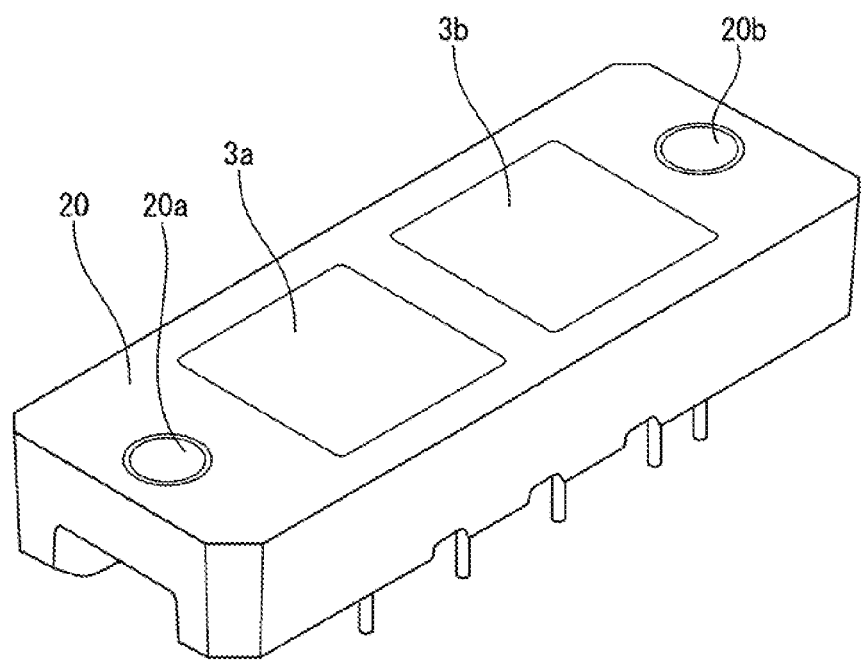
FIG. 3 is a perspective view schematically illustrating the basic configuration of the semiconductor device according to the embodiment of the present invention as viewed from a bottom surface side.

Moreover, as illustrated in FIG. 3, on the lower surface side of the semiconductor device, the primary surface of a heat sink plate 3a of the insulated circuit board (1a, 2a, 2b, 3a) is exposed. This exposed primary surface of the heat sink plate 3a functions as a heat-radiating surface in the semiconductor device, which has a heat radiating base-less structure.

Next, the internal structure of the semiconductor device will be described in detail with reference to FIGS. 1, 4, and 5. As illustrated in FIG. 1, the insulated circuit board (1a, 2a, 2b, 3a) of the left-side semiconductor module includes an insulating board 1a made of a ceramic or the like, a primary metal layer 2a and an auxiliary metal layer 2b formed as films on the upper surface of the insulating board 1a, and the heat sink plate 3a which is formed as a film on the bottom surface of the insulating board 1a, for example. Moreover, similar to in the left-side semiconductor module, the insulated circuit board (1b, 2c-2e, 3b) of the right-side semiconductor module includes an insulating board 1b; a primary metal layer 2c and auxiliary metal layers 2d and 2e; and a heat sink plate 3b. In FIG. 1, the right-side semiconductor module differs from the left-side semiconductor module in that the number of auxiliary metal layers and the number of external terminals is different, while the other components that have the same names are identical in structure. Because the two semiconductor modules have similar structures, the following description will focus primarily on the left-side semiconductor module in FIG. 1.

The primary metal layer 2a, the auxiliary metal layer 2b, and the heat sink plate 3a of the insulated circuit board (1a, 2a, 2b, 3a) of the left-side semiconductor module in FIG. 1 are each made of copper (Cu) or aluminum (Al) or the like and have a thickness of approximately 1 mm to approximately 1.5 mm, for example. A DCB substrate made using a direct copper bonding (DCB) process, an AMB substrate made using an active metal brazing (AMB) process, or the like can be used as the insulated circuit board (1a, 2a, 2b, 3a) that includes the insulating board 1a, the primary metal layer 2a, and the auxiliary metal layer 2b. The semiconductor device according to this embodiment of the present invention will be described using a DCB substrate as an example.

The primary metal layer 2a and the auxiliary metal layer 2b are circuit patterns of the semiconductor device, and recesses 21a and 21b respectively corresponding to the external terminals 9a and 9b are formed in the primary metal layer 2a and the auxiliary metal layer 2b. First bonding material 4a and 4b such as solder is respectively arranged inside the recesses 21a and 21b.

The external terminals 9a and 9b are cylinder-shaped conductive members and are fixed to the primary metal layer 2a via the conductive first bonding material 4a and 4b, with the bottom ends of the external terminals 9a and 9b respectively inserted into the recesses 21a and 21b of the circuit patterns. The external terminals 9a and 9b are arranged standing so as to extend upwards orthogonal to the principal surface of the insulated circuit board (1a, 2a, 2b, 3a). The external terminals 9a and 9b are conductively connected via the first bonding material 4a and 4b to the circuit patterns formed in the primary metal layer 2a and auxiliary metal layer 2b.

It is preferable that the diameter of the external terminals 9a and 9b be not less than approximately 0.5 mm and not more than approximately 1.5 mm; for example, the diameter can be set to approximately 1.0 mm. If the diameter is less than 0.5 mm, increased inductance becomes a concern. If the diameter is greater than 1.5 mm, the external terminals are too large and become difficult to bond to other members using solder or the like.

As illustrated in FIG. 1, the amount of first bonding material 4a and 4b arranged inside the recesses 21a and 21b is controlled so as to make it possible to achieve sufficient adhesion and bond strength with the bottom surfaces and outer peripheral surfaces of the bottom ends of the external terminals 9a and 9b. The amount of first bonding material 4a and 4b is also controlled so as to keep the first bonding material 4a and 4b contained inside the recesses 21a and 21b without spreading out onto the upper surfaces of the primary metal layer 2a and the auxiliary metal layer 2b.

Similar to the insulated circuit board (1a, 2a, 2b, 3a), the printed circuit board 28 (8, 14, 15) has a three-layer structure including an insulating substrate 8, an upper circuit pattern 14 formed on the upper surface of the insulating substrate 8, and a lower circuit pattern 15 formed on the lower surface of the insulating substrate 8. The upper circuit pattern 14 and the lower circuit pattern 15 are both conductive films made of a metal or the like. Circular terminal through holes 8a, 8b of the same diameter as or of slightly smaller diameter than the external terminals 9a and 9b are formed in the printed circuit board 28 (8, 14, 15) coaxially with the respectively corresponding external terminals 9a and 9b. Here, ten terminal through holes corresponding to the ten external terminals are formed in the printed circuit board 28 (8, 14, 15).

In FIG. 1, the external terminal 9a on the left side on the insulated circuit board (1a, 2a, 2b, 3a) is inserted through the terminal through hole 8a above that external terminal 9a, and the external terminal 9b on the right side is inserted through the terminal through hole 8b above that external terminal 9b. The external terminals 9a and 9b only contact the printed circuit board 28 (8, 14, 15) via the terminal through holes 8a and 8b and are supported by the compressive fit from the terminal through holes 8a and 8b.

Similar to in the left-side semiconductor module, in the right-side semiconductor module in FIG. 1 a plurality of external terminals are press-fitted into and supported by the printed circuit board 28 (8, 14, 15) via respectively corresponding terminal through holes. The bottom ends of the ten external terminals are respectively fixed via the first bonding material into ten recesses in the insulated circuit boards, and portions above the bottom ends are directly supported by the ten terminal through holes in the printed circuit board 28 (8, 14, 15). This increases the overall strength of the semiconductor modules.

Moreover, on the primary metal layer 2a of the left-side insulated circuit board (1a, 2a, 2b, 3a) in FIG. 1, a plurality of semiconductor chips (power semiconductor devices) are arranged electrically connected to the primary metal layer 2a via a second bonding material 5 such as solder. Below, a semiconductor chip 6 which is depicted overlapping with the external terminal 9b on the right side on the insulated circuit board (1a, 2a, 2b, 3a) in FIG. 1 will be described as a representative example, and reference characters for the other semiconductor chips will be omitted. Examples of power semiconductor devices that can be used include insulated-gate bipolar transistors (IGBTs), metal-oxide-semiconductor field-effect transistors (MOSFETs), diodes, and the like.

On the semiconductor chip 6, a first implant pin 10a is arranged electrically connected to the semiconductor chip 6 via a third bonding material 7. Moreover, in regions other than the semiconductor chip 6 on the primary metal layer 2a and the auxiliary metal layer 2b that form the circuit patterns, second implant pins are arranged connected to the primary metal layer 2a and the auxiliary metal layer 2b via a metal layer-pin bonding material such as solder. In FIG. 1, the metal layer-pin bonding material 11 and the second implant pins 10b arranged on the auxiliary metal layer 2b are illustrated as examples.

The plurality of first implant pins and second implant pins are conductive members which electrically connect the insulated circuit board (1a, 2a, 2b, 3a) and the printed circuit board 28 (8, 14, 15). In the present specification, the first implant pin 10a on the semiconductor chip 6 will be described as a representative example of the plurality of first implant pins connected to the semiconductor chips. Moreover, the second implant pin 10b positioned on the right side of the external terminal 9b with one pin interposed therebetween will be described as a representative example of the plurality of second implant pins connected to the circuit patterns. Reference characters for the other first implant pins and second implant pins will be omitted.

Figure 4:
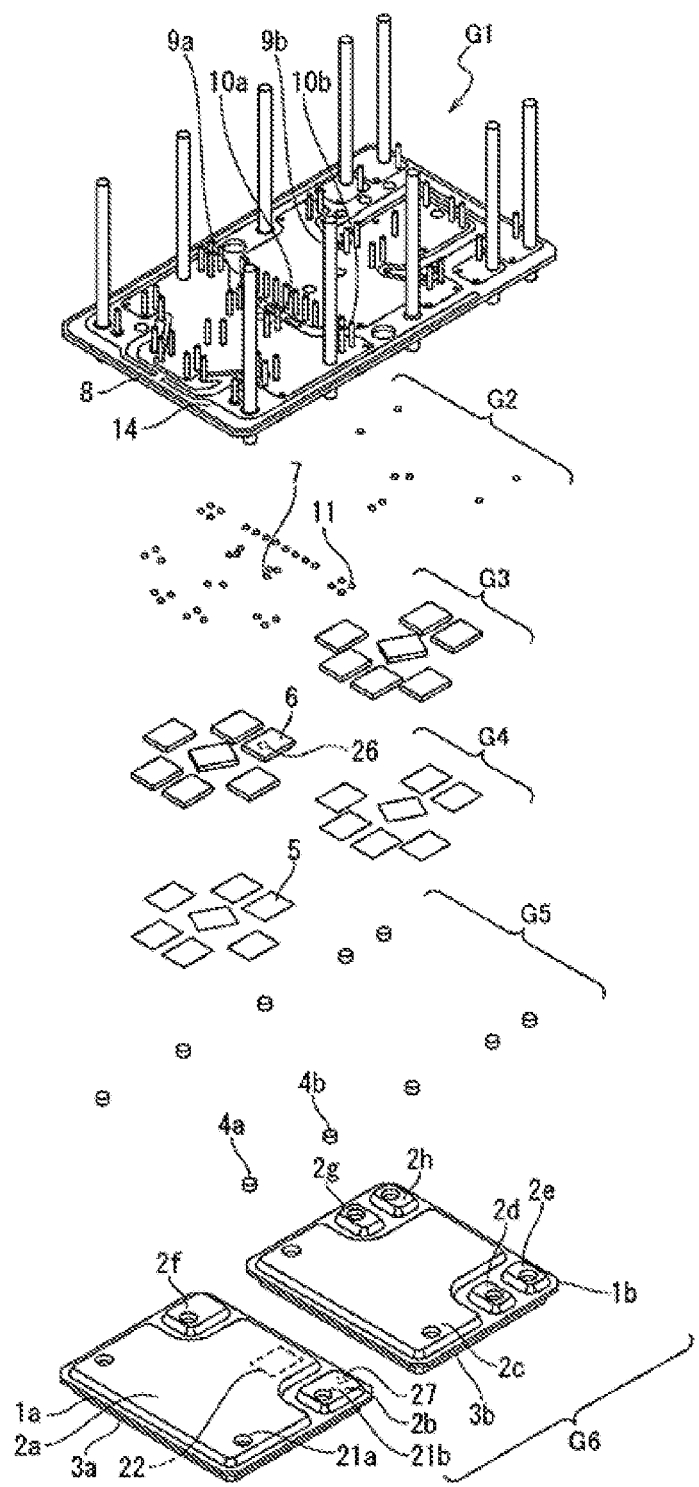
FIG. 4 is an exploded perspective view schematically illustrating a basic interior configuration of the semiconductor device according to the embodiment of the present invention.

As illustrated in the uppermost level of FIG. 4, the plurality of external terminals 9a and 9b, the first implant pins 10a, and the second implant pins 10b are embedded in and directly supported by the printed circuit board. Hereinafter, the circuit board that supports the plurality of external terminals 9a and 9b, the first implant pins 10a, and the second implant pins 10b will be referred to as an "implant printed circuit board (implant printed circuit board G1)".

Among a pair of insulated circuit boards G6 at the lowermost level of FIG. 4, the left-side insulated circuit board corresponds to the left-side insulated circuit board in FIG. 1 and includes the primary metal layer 2a, which is substantially T-shaped when viewed from the upper surface side, as well as two auxiliary metal layers 2b and 2f which are formed near the primary metal layer 2a and are substantially rectangular when viewed from the upper surface side.

In the positions at both ends of the horizontal bar portion of the T-shape in the upper surface of the primary metal layer 2a, two recesses which include the recess 21a into which the external terminal 9a will be inserted from the upper side are formed.

The two auxiliary metal layers 2b and 2f are arranged symmetrically about the vertical bar portion of the T-shape of the primary metal layer 2a so as to be on both sides of this vertical bar region and also be separated from the primary metal layer 2a. A recess into which an external terminal will be inserted is formed in the upper surface of each of the two auxiliary metal layers 2b and 2f.

Meanwhile, the right-side insulated circuit board of the pair of insulated circuit boards G6 corresponds to the right-side insulated circuit board in FIG. 1 and includes the primary metal layer 2c, which is substantially T-shaped when viewed from the upper surface side, as well as four auxiliary metal layers 2d, 2e, 2g and 2h which are formed near the primary metal layer 2c and are substantially rectangular when viewed from the upper surface side. In the positions at both ends of the horizontal bar portion of the T-shape in the upper surface of the primary metal layer 2c, two recesses into which external terminals will be inserted from the upper side are formed.

The four auxiliary metal layers 2d, 2e, 2g and 2h are arranged symmetrically about the vertical bar portion of the T-shape of the primary metal layer 2c so as to be on both sides of this vertical bar region, with two auxiliary metal layers per side, and also be separated from the primary metal layer 2c and the respective neighboring auxiliary metal layer. A recess into which an external terminal will be inserted is formed in the upper surface of each of the four auxiliary metal layers 2d, 2e, 2g and 2h.

Moreover, on the upper surface of the semiconductor chip 6 included in a semiconductor chip group G3 in the third level from the top in FIG. 4, the dashed ellipse represents a first planned pin-bonding position 26 which is the intended position at which the third bonding material 7 will be bonded. The third bonding material 7 is included in a pin-bonding material group G2 in the second level from the top in FIG. 4. Furthermore, on the upper surface of the primary metal layer 2a of the left-side insulated circuit board of the pair of insulated circuit boards G6, the dashed rectangle represents a planned chip-mounting position 22 at which the semiconductor chip 6 will be bonded. In addition, on the upper surface of the auxiliary metal layer 2b of this insulated circuit board, the dashed line represents a second planned pin-bonding position 27 which is the intended position at which the metal layer-pin bonding material 11 will be bonded.

In other words, the semiconductor chip 6 is mounted overlapping with the planned chip-mounting position 22 on the upper surface of the auxiliary metal layer 2a of the left-side insulated circuit board of the pair of insulated circuit boards G6, with the second bonding material 5 included in a second bonding material group G4 interposed therebetween. Moreover, the first implant pin 10a is bonded via the third bonding material 7 to the first planned pin-bonding position 26 on the upper surface of the semiconductor chip 6. Furthermore, the bottom end of the second implant pin 10b is bonded via the metal layer-pin bonding material 11 to the second planned pin-bonding position 27 on the auxiliary metal layer 2b of the insulated circuit board. In addition, the first bonding material 4a and 4b included in a first bonding material group G5 is arranged inside the recesses 21a and 21b in the insulated circuit board.

Figure 5:
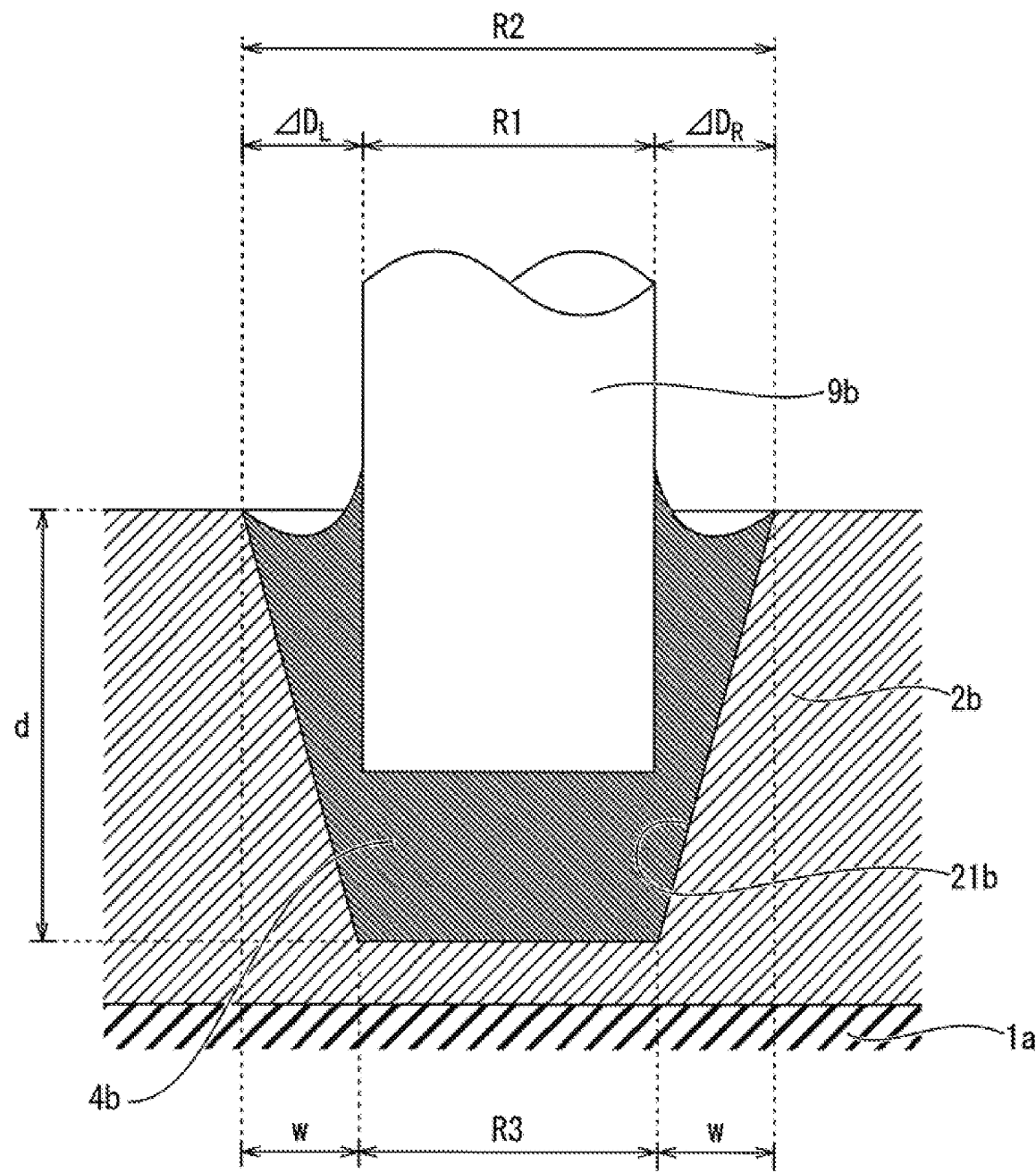
FIG. 5 is a cross-sectional view schematically illustrating a partially enlarged view of a connected portion of an external terminal and an insulated circuit board in the semiconductor device according to the embodiment of the present invention.

As illustrated in FIG. 5, the recess 21b into which the external terminal 9b is inserted has an inverted trapezoid-shaped cross-sectional shape. If the opening of the recess 21b is circular, the recess 21b has an inverted circular truncated cone shape. The sidewalls of the recess 21b have a slanted surface. In consideration of bond strength and reducing the amount of first bonding material, the ratio between the width w and depth d of the slanted surface is set to 0.3:1.0. The bottom of the recess 21b is the upper surface of the auxiliary metal layer 2b, which is thinner than the auxiliary metal layer 2b in the areas surrounding the recess 21b. The width R2 of the opening of the recess 21b is equal to the maximum width R1 of the external terminal 9b at the height of the opening plus a prescribed positional shift margin $(\Delta D_L + \Delta D_R)$. In other words, the width R2 of the opening is greater than the width R3 of the bottom by an amount equal to the positional shift margin $(\Delta D_L + \Delta D_R)$.

The positional shift margin $(\Delta D_L + \Delta D_R)$ is a value set so as to ensure that when the bottom ends of the ten external terminals of the semiconductor device are inserted into the corresponding recesses during assembly, the bottom ends of all of the external terminals are simultaneously inserted reliably. It is preferable that the positional shift margin $(\Delta D_L + \Delta D_R)$ be not less than 0.5 mm and not more than 3 mm. For example, when the diameter (maximum width R1 at the opening) of the external terminal is approximately 1.0 mm, the positional shift margin $(\Delta D_L + \Delta D_R)$ can be set to approximately 1.0 mm, in which case the width R2 of the opening of the recess would be approximately 2.0 mm.

If the positional shift margin $(\Delta D_L + \Delta D_R)$ is less than 0.5 mm, the width is too small and positional shifts cannot be sufficiently accommodated. If the positional shift margin $(\Delta D_L + \Delta D_R)$ is greater than 3 mm, the openings are large and the area of the upper surfaces of the primary metal layer and the auxiliary metal layers becomes too large, which increases the size of the semiconductor device. In other words, the total area of the metal layers could potentially become substantially as large as the solder wetting and spreading regions surrounding the external terminals in a case in which the external terminals are stood up via solder on a flat upper surface of a metal layer, as is described in Patent Document 1.

In the semiconductor device according to this embodiment of the present invention, the portions of the external terminals above the bottom ends are press-fitted into the terminal through holes in the printed circuit board and are directly and firmly supported by the compressive force applied by the printed circuit board. Meanwhile, on the bottom ends of the external terminals, the bottom surfaces and outer peripheral surfaces of the bottom ends of the external terminals are firmly fixed via the first bonding material into the recesses formed in the primary metal layers and auxiliary metal layers. This of course gives the semiconductor device greater bend strength than when no first bonding material is used and also significantly increases the strength in comparison to bonding just the bottom end faces of the external terminals onto the upper surfaces of the metal layers.

Moreover, in the semiconductor device according to this embodiment of the present invention, the amount of first bonding material is controlled so as to remain inside the recesses, thereby avoiding excessive wetting and spreading of the first bonding material such as solder onto the primary metal layers and auxiliary metal layers. This prevents solder for the external terminals and solder for the semiconductor chips near the external terminals from contacting each other and makes it possible to reduce the distances between the external terminals and semiconductor chips. This, in turn, makes it possible to reduce the overall area of the primary metal layers and auxiliary metal layers, thereby making it possible to miniaturize the semiconductor device and provide the semiconductor device at low cost.

Furthermore, in the semiconductor device according to this embodiment of the present invention, the ratio between the width and depth of the slanted surfaces of the recesses is set to 0.3:1.0. This limits the amount of first bonding material to the minimum required, inhibits spreading of the first bonding material to outside of the recesses, and also makes it possible to achieve sufficient bond strength between the external terminals and metal layers.

—Method of Manufacturing Semiconductor Device—

Figure 6:
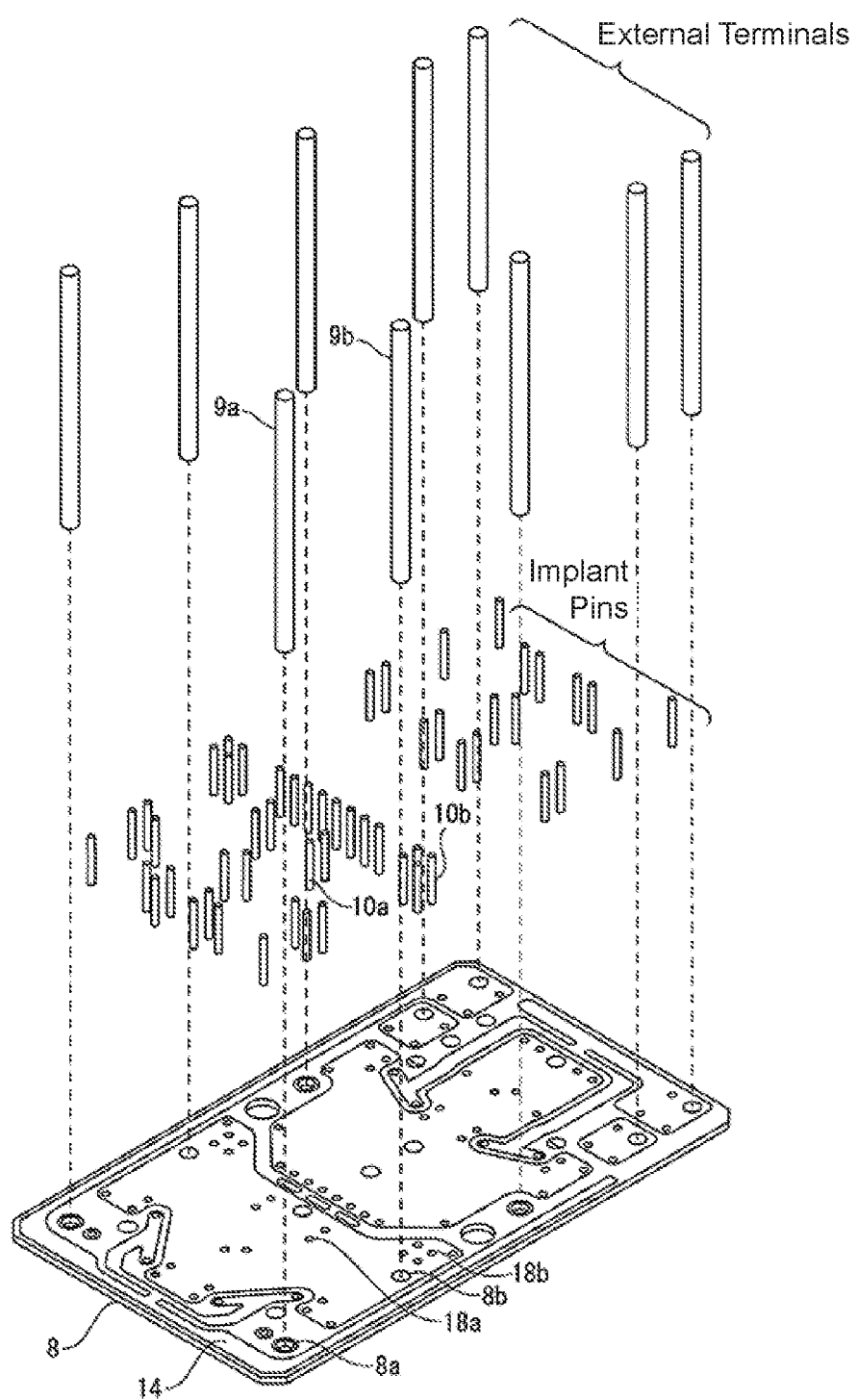
FIG. 6 is an exploded perspective view schematically illustrating a (first) step in a method of manufacturing a semiconductor device according to an embodiment of the present invention.
Figure 7:
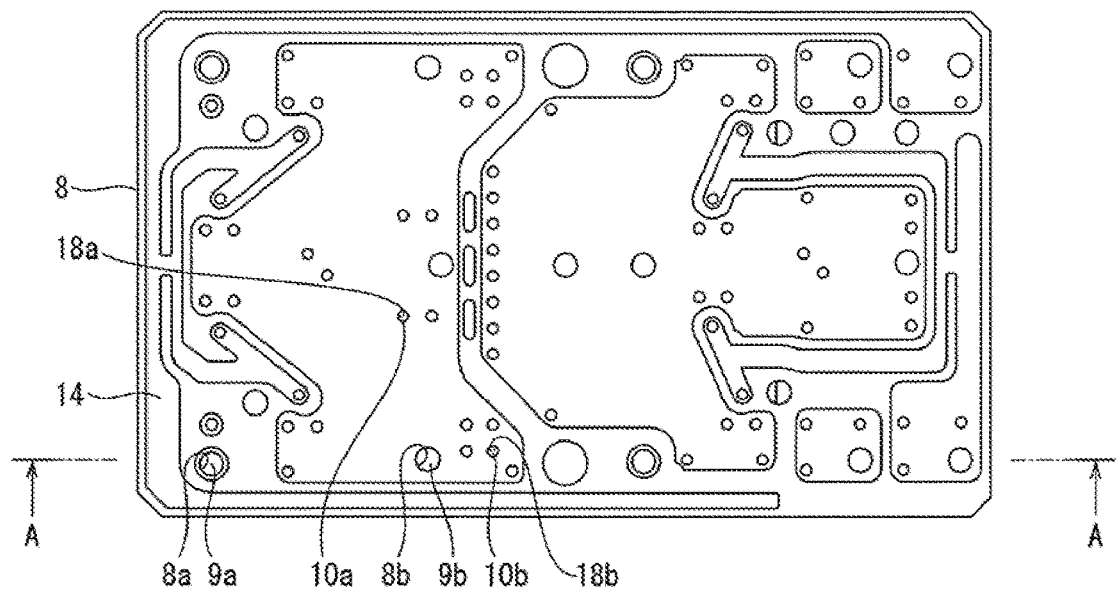
FIG. 7 is a plan view schematically illustrating a (second) step in the method of manufacturing a semiconductor device according to the embodiment of the present invention.

Next, a method of manufacturing a semiconductor device according to an embodiment of the present invention will be described with reference to FIGS. 6 to 21. First, as illustrated in FIG. 6, a printed circuit board 28 (8, 14, 15) having through holes formed therein for supporting a plurality of external terminals, first implant pins, and second implant pins is prepared. External terminals 9a and 9b are inserted into terminal through holes 8a and 8b, a first implant pin 10a is inserted into a first pin through hole 18a, and a second implant pin 10b is inserted into a second pin through hole 18b. Then, as illustrated in FIG. 7, all of the external terminals, first implant pins, and second implant pins are respectively press-fitted through the respectively corresponding through holes to prepare an implant printed circuit board.

Figure 8:
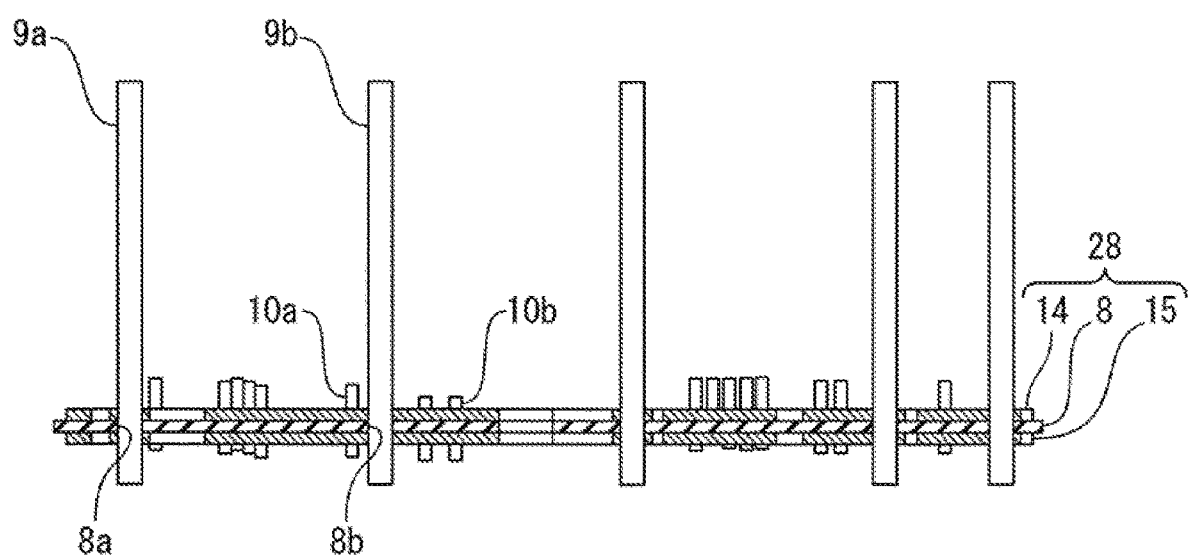
FIG. 8 is a cross-sectional view taken along the A-A direction in FIG. 8.

The external terminals 9a and 9b are press-fitted through the terminal through holes 8a and 8b and are directly supported by the printed circuit board 28 (8, 14, 15), and therefore the precision of the spacing (hereinafter, "relative positioning") between the external terminals relative to the design values depends on the patterning precision of the terminal through holes. As illustrated in FIG. 8, the external terminals 9a and 9b, the first implant pin 10a, and the second implant pin 10b are respectively supported with prescribed lengths thereof (press-fitted amounts) protruding out from the bottom surface of the printed circuit board 28 (8, 14, 15).

Figure 9:
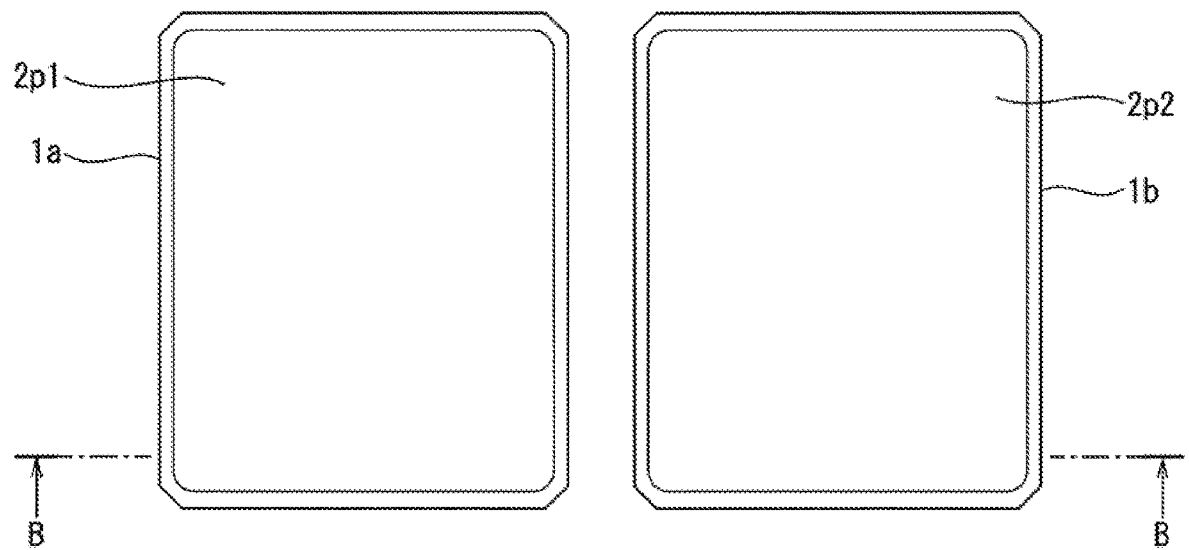
FIG. 9 is a plan view schematically illustrating a (third) step in the method of manufacturing a semiconductor device according to the embodiment of the present invention.
Figure 10:
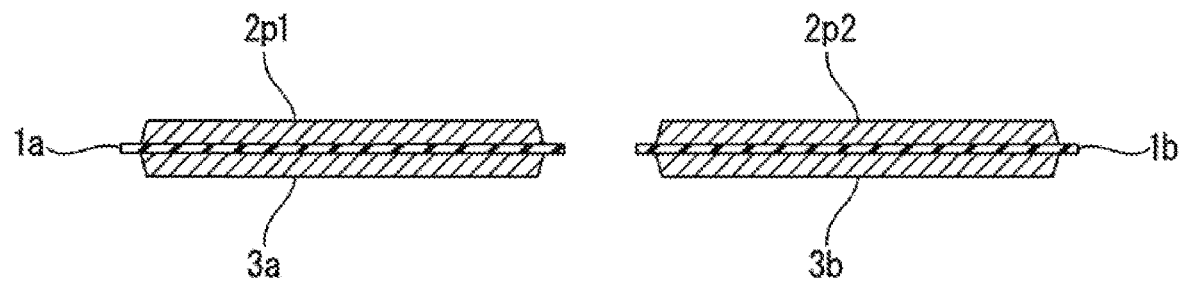
FIG. 10 is a cross-sectional view taken along the B-B direction in FIG. 9.
Figure 11:
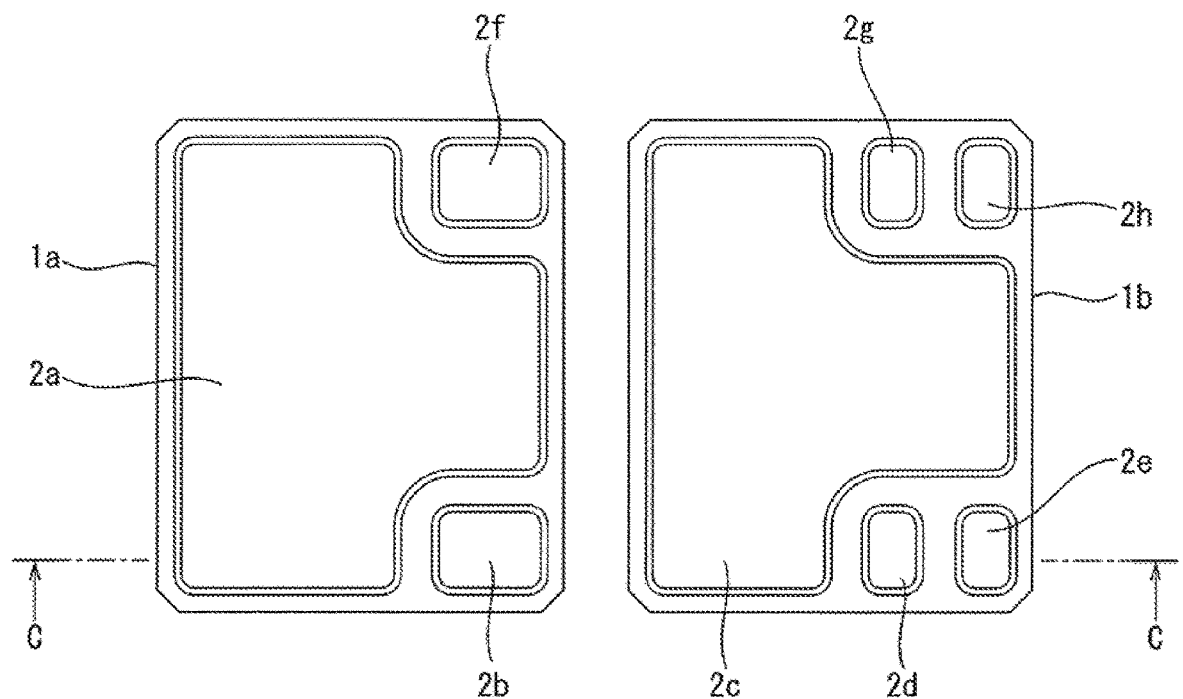
FIG. 11 is a plan view schematically illustrating a (fourth) step in the method of manufacturing a semiconductor device according to the embodiment of the present invention.
Figure 12:
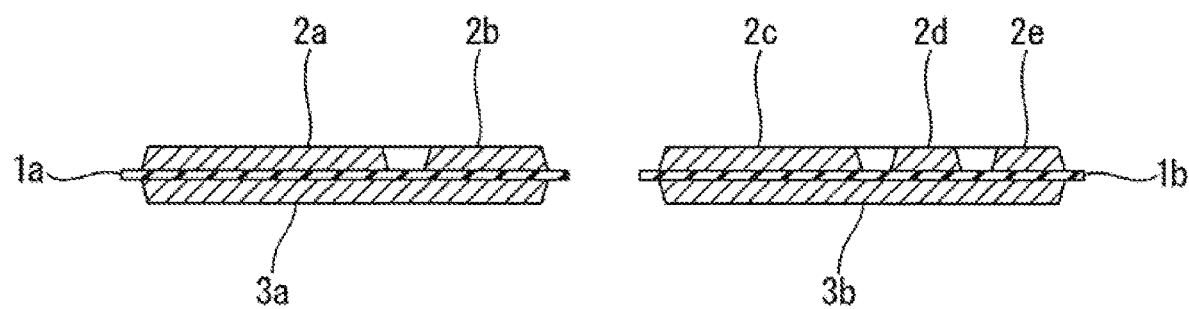
FIG. 12 is a cross-sectional view taken along the C-C direction in FIG. 11.
Figure 13:
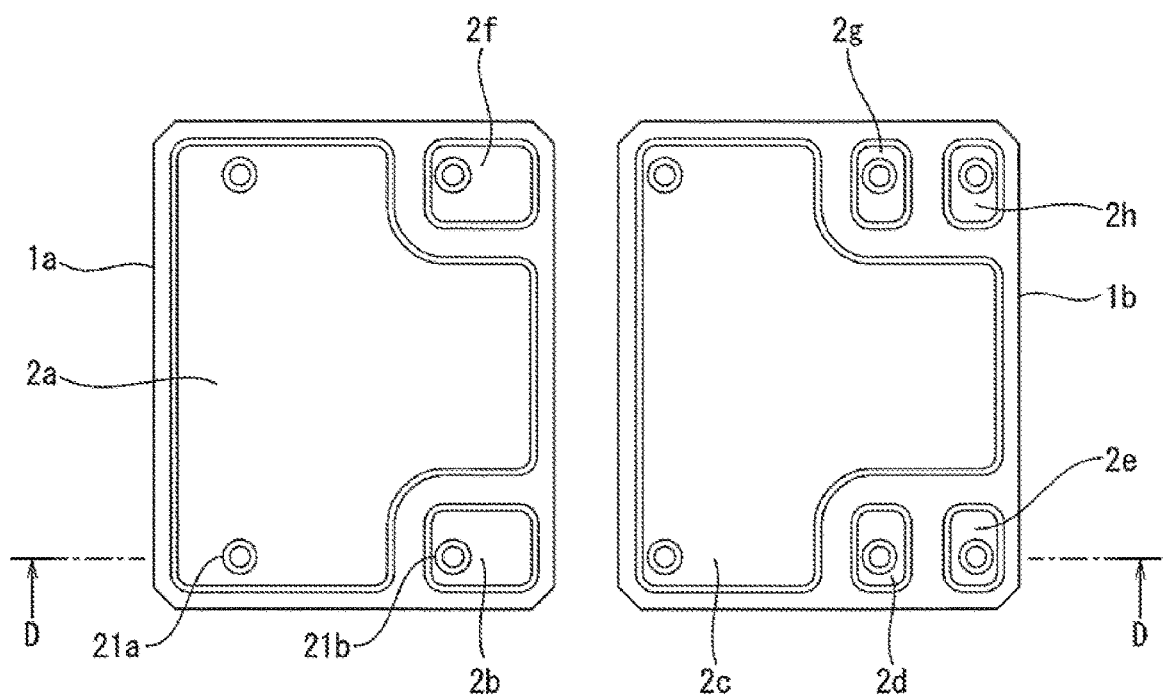
FIG. 13 is a plan view schematically illustrating a (fifth) step in the method of manufacturing a semiconductor device according to the embodiment of the present invention.

Next, as illustrated in FIGS. 9 and 10, two DCB substrates respectively having flat metal plates 2p1 and 2p2 on the upper surfaces of insulating boards 1a and 1b and respectively having flat heat sink plates 3a and 3b on the bottom surfaces are prepared as insulated circuit boards. Then, as illustrated in FIGS. 11 and 12, an etching process is performed on the respective insulated circuit boards so as to form circuit patterns in which primary metal layers 2a and 2c and auxiliary metal layers 2b and 2d to 2h are respectively formed separated from one another in the flat metal plates 2p1 and 2p2. Next, as illustrated in FIGS. 13 and 14, the insulated circuit boards in which the primary metal layers 2a and 2c and the auxiliary metal layers 2b and 2d to 2h are respectively formed are etched again using a mask for forming prescribed recesses in order to form recesses 21a and 21b.

Figure 14:
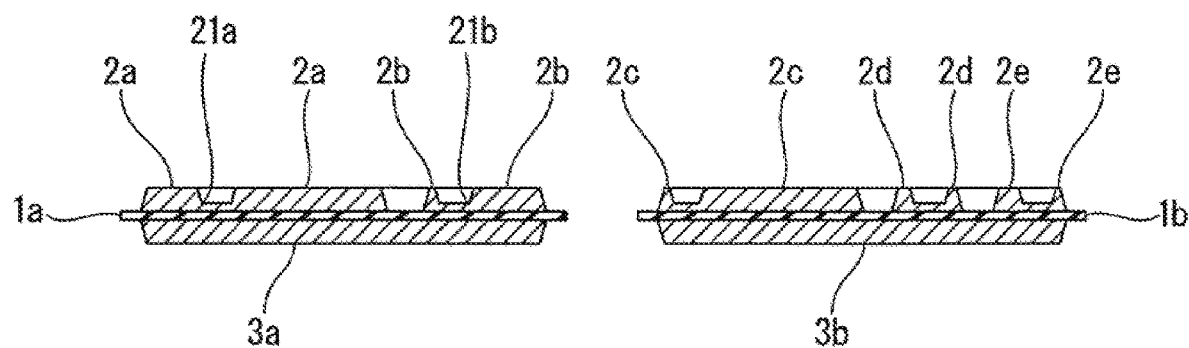
FIG. 14 is a cross-sectional view taken along the D-D direction in FIG. 13.

As illustrated in FIG. 14, the two-step etching process of starting with the flat metal plates 2p1 and 2p2 and ending with forming the recesses 21a and 21b allows the depth of the recesses 21a and 21b to be different from the depth of the circuit pattern trenches and makes it possible to leave a thin metal layer remaining at the bottoms of the recesses 21a and 21b. The recesses 21a and 21b are etched out so as to have an opening width equal to the maximum width of the external terminals 9a and 9b at the height of the opening when the external terminals 9a and 9b are inserted into the recesses 21a and 21b plus a positional shift margin which is set to not less than 0.5 mm and not more than 3 mm. In the steps described with reference to FIGS. 9 to 14, the insulated circuit boards to be assembled together with the implant printed circuit board are prepared.

Figure 15:
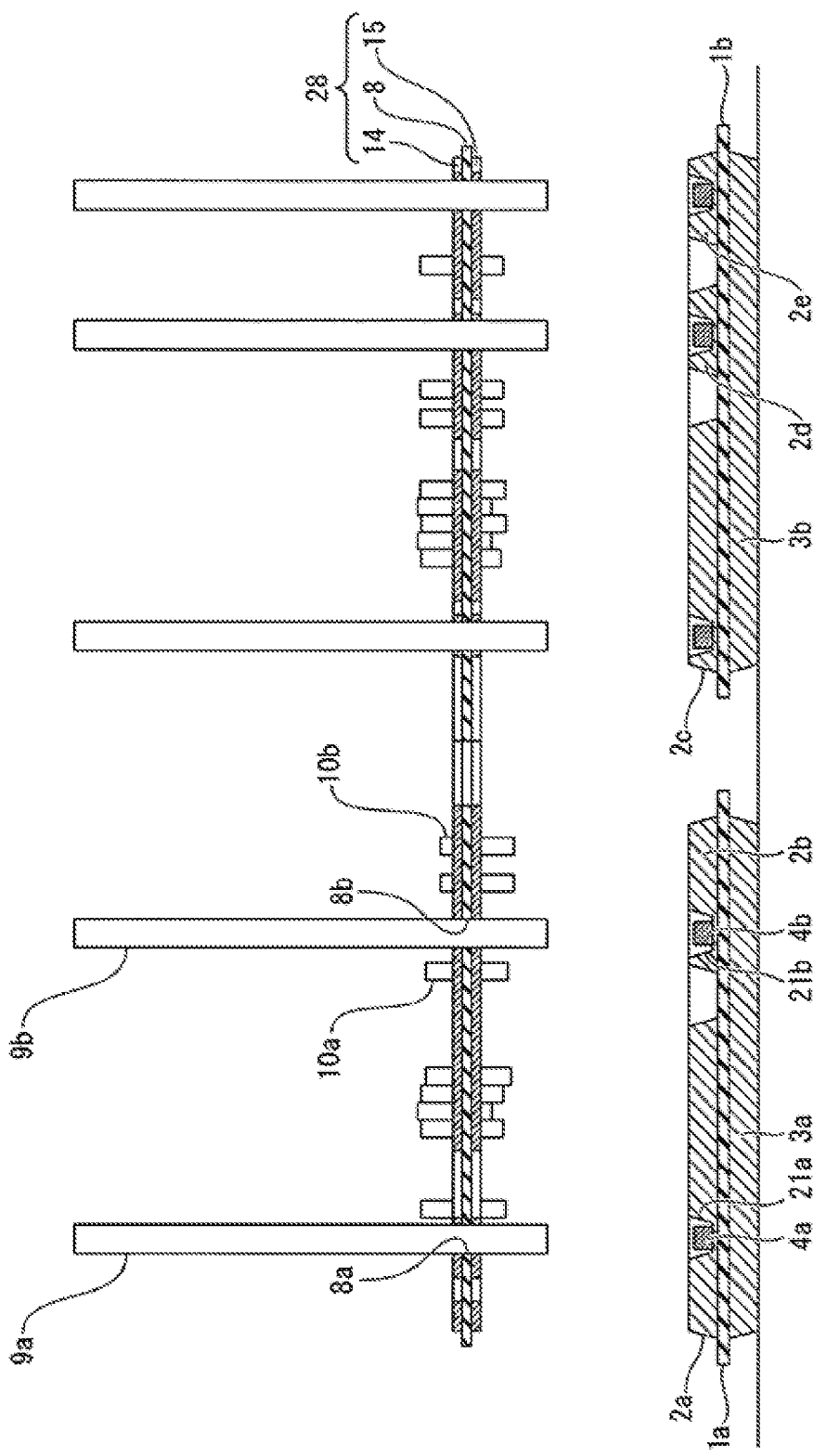
FIG. 15 is a cross-sectional view schematically illustrating a (sixth) step in the method of manufacturing a semiconductor device according to the embodiment of the present invention.
Figure 16:
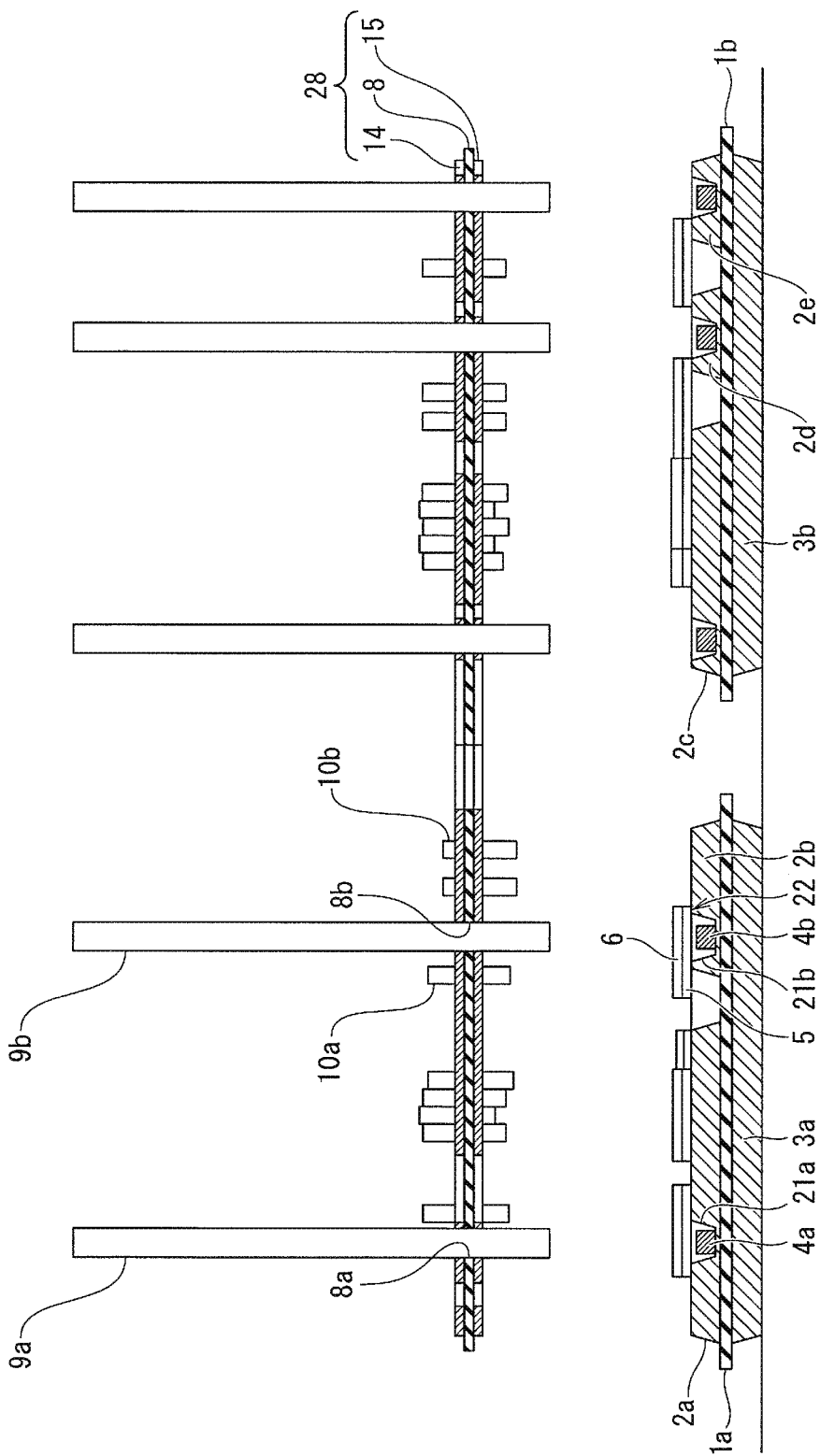
FIG. 16 is a cross-sectional view schematically illustrating a (seventh) step in the method of manufacturing a semiconductor device according to the embodiment of the present invention.

Next, as illustrated in FIG. 15, first bonding material 4a and 4b such as solder cream is arranged inside the recesses 21a and 21b in the insulated circuit boards. Then, as illustrated in FIG. 16, a semiconductor chip 6 is mounted via a second bonding material 5 onto a planned chip-mounting position 22 on the upper surface of the primary metal layer 2a of the insulated circuit board.

Figure 17:
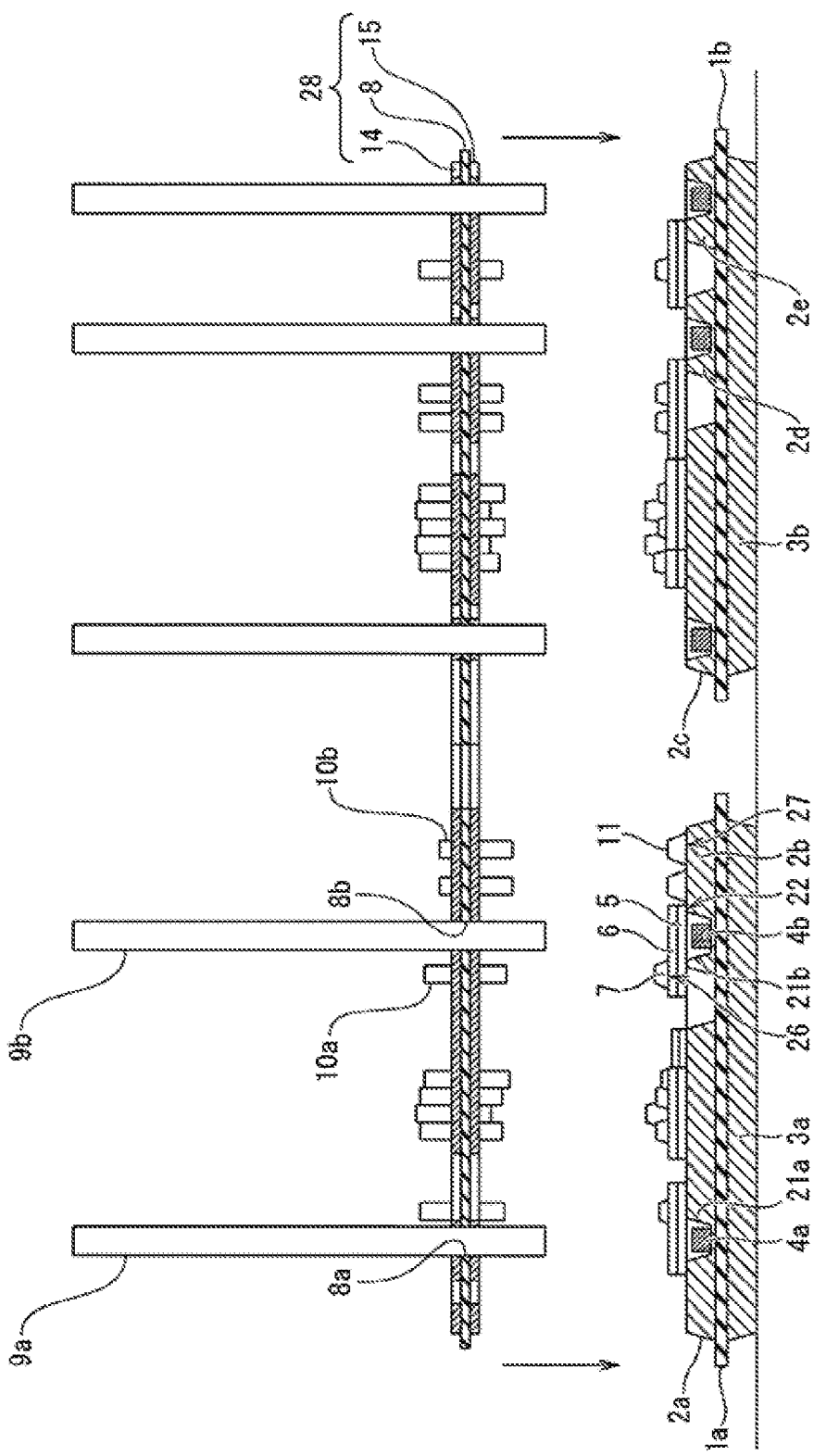
FIG. 17 is a cross-sectional view schematically illustrating a (eighth) step in the method of manufacturing a semiconductor device according to the embodiment of the present invention.

Next, as illustrated in FIG. 17, a third bonding material 7 is arranged at a first planned pin-bonding position 26 on the upper surface of the mounted semiconductor chip 6, and a metal layer-pin bonding material 11 is arranged at a second planned pin-bonding position 27 on the upper surface of the auxiliary metal layer 2b. Solder cream or the like can be used for each of the second bonding material 5, the third bonding material 7, and the metal layer-pin bonding material 11. Then, the implant printed circuit board is brought near the two insulated circuit boards on the lower side thereof, and the external terminals 9a and 9b are lowered into the respectively corresponding recesses 21a and 21b.

Figure 18:
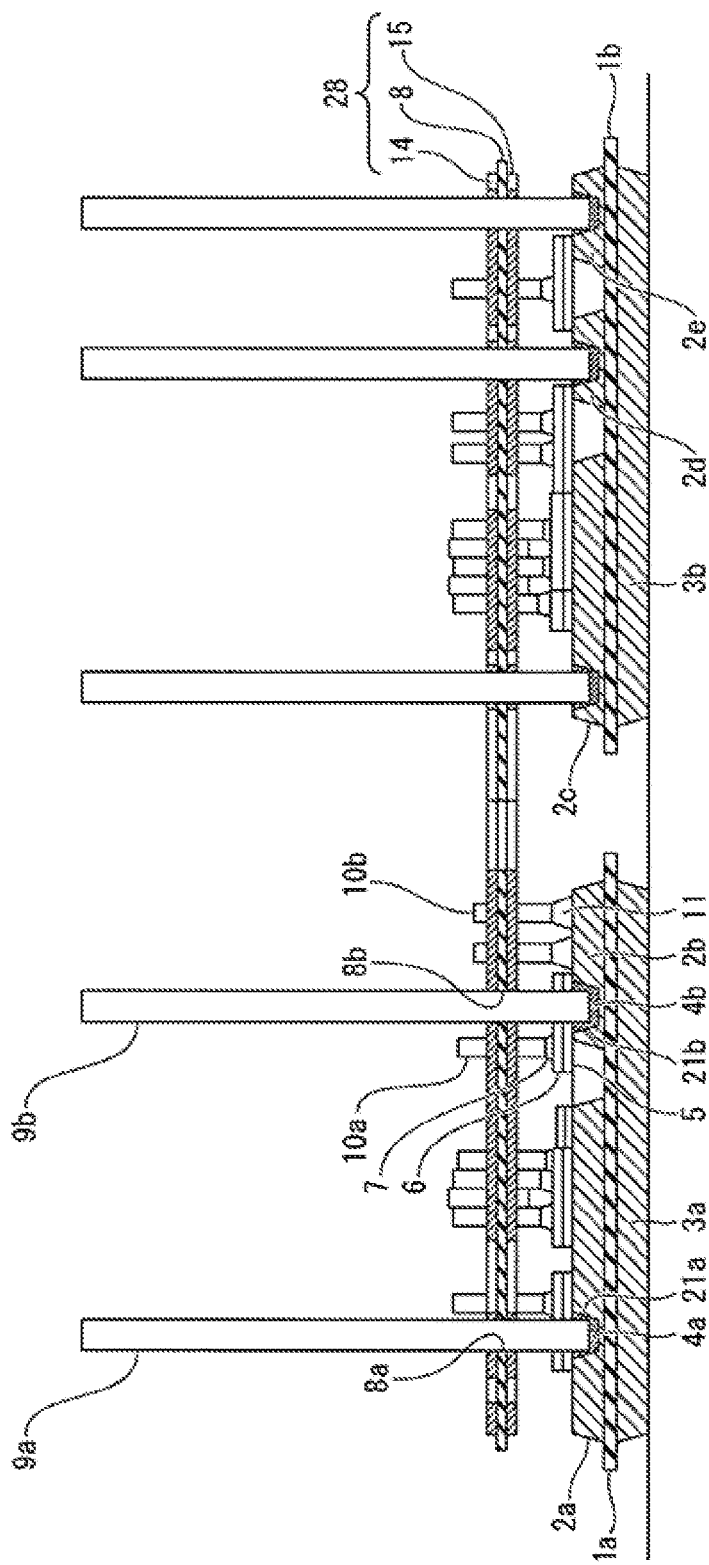
FIG. 18 is a cross-sectional view schematically illustrating a (ninth) step in the method of manufacturing a semiconductor device according to the embodiment of the present invention.

As illustrated in FIG. 18, when the external terminals 9a and 9b are lowered, the bottom ends of the external terminals 9a and 9b respectively contact the first bonding material 4a and 4b inside the recesses 21a and 21b, with the bottom ends remaining separated from the bottoms of the recesses 21a and 21b. The bottom end of the first implant pin 10a contacts the third bonding material 7 on the semiconductor chip 6, and the bottom end of the second implant pin 10b contacts the metal layer-pin bonding material 11 on the auxiliary metal layer 2b.

Here, the operation of lowering the implant printed circuit board onto the insulated circuit boards and the height of the implant printed circuit board from the insulated circuit boards will be described. When the plurality of recesses can be precisely formed to have the same prescribed depth in the primary metal layers and the auxiliary metal layers using a machining process or the like, the initial height of the implant printed circuit board can be set to a value of (press-fitted amount of external terminals)−(depth of recesses), for example.

Inputting the obtained height value via a height regulation device to a lowering jig connected thereto that supports the implant printed circuit board and moves the implant printed circuit board in the up and down directions eliminates the need to use separate positioning members such as dummy pins for achieving high precision. Moreover, during the process of inserting the external terminals into the recesses, the external terminals are inserted until the bottom end faces of the external terminals contact the bottoms of the recesses.

Furthermore, subtracting the press-fitted amount of the first implant pin 10a from the height of the implant printed circuit board makes it possible to calculate the thickness of chip-pin bonding material that should be arranged on the semiconductor chips. Similarly, subtracting the press-fitted amount of the second implant pin 10b from the height of the implant printed circuit board makes it possible to calculate the thickness of metal layer-pin bonding material that should be arranged on the metal layers.

However, if the bottom end faces of the external terminals are in close contact with the bottoms of the recesses, the amount of first bonding material adhered to the bottom end face sides of the external terminals decreases. Thus, in consideration of bond strength, the initial height of the implant printed circuit board may be corrected. For example, after inserting the external terminals until the bottom end faces of the external terminals contact the bottoms of the recesses, the bottom ends may be pulled back up by a prescribed amount inside the recesses to create gaps so as to allow the first bonding material to exist between the bottom end faces and bottoms, thereby increasing bond strength.

In particular, during manufacture of the external terminals, a plurality of burs or the like of various sizes are sometimes formed on the bottom end faces of the external terminals to roughen those bottom end faces, and when viewed under magnification, the bottom end faces may not be flat. Typically, the roughness of the bottom end faces differs slightly for each external terminal, and therefore the heights of the bottom end faces of the external terminals to be inserted into the recesses differ slightly. As a result, even if the depths of the plurality of recesses are formed precisely, the rough shapes of the bottom end faces of the external terminals inserted into the respective recesses can potentially cause the overall semiconductor module to not be level. Thus, pulling the bottom ends back up by a prescribed amount inside the recesses such that the bottom end faces of the external terminals are lifted from the bottoms makes it possible to eliminate concerns of this nature.

Meanwhile, when it is not possible to precisely form the plurality of recesses to have the same prescribed depth, such as when the recesses are formed using etching or the like, first the press-fitted amount of the first implant pins and the thickness of the chip-pin bonding material are determined. Alternatively, the press-fitted amount of the second implant pins and the thickness of the metal layer-pin bonding material are determined. Then, a value of (press-fitted amount of first implant pins)+(thickness of chip-pin bonding material) or a value of (press-fitted amount of second implant pins)+(thickness of metal layer-pin bonding material) is calculated as the height of the implant printed circuit board.

Then, the obtained height value is input via the height regulation device connected to the jig for lowering the implant printed circuit board. Here, if the press-fitted amounts of the first implant pins and the second implant pins, the thicknesses of the chip-pin bonding material and the metal layer-pin bonding material, or the like cannot be accurately calculated, dummy pins or the like for achieving high precision can be incorporated and used in the semiconductor modules. In such a case, when the external terminals are inserted into the recesses, the bottom end faces of the external terminals are separated from the bottoms of the recesses by a prescribed distance so as to not contact the bottoms. Below, the description of the method of manufacturing the semiconductor device following the state illustrated in FIG. 18 will be continued.

Figure 19:
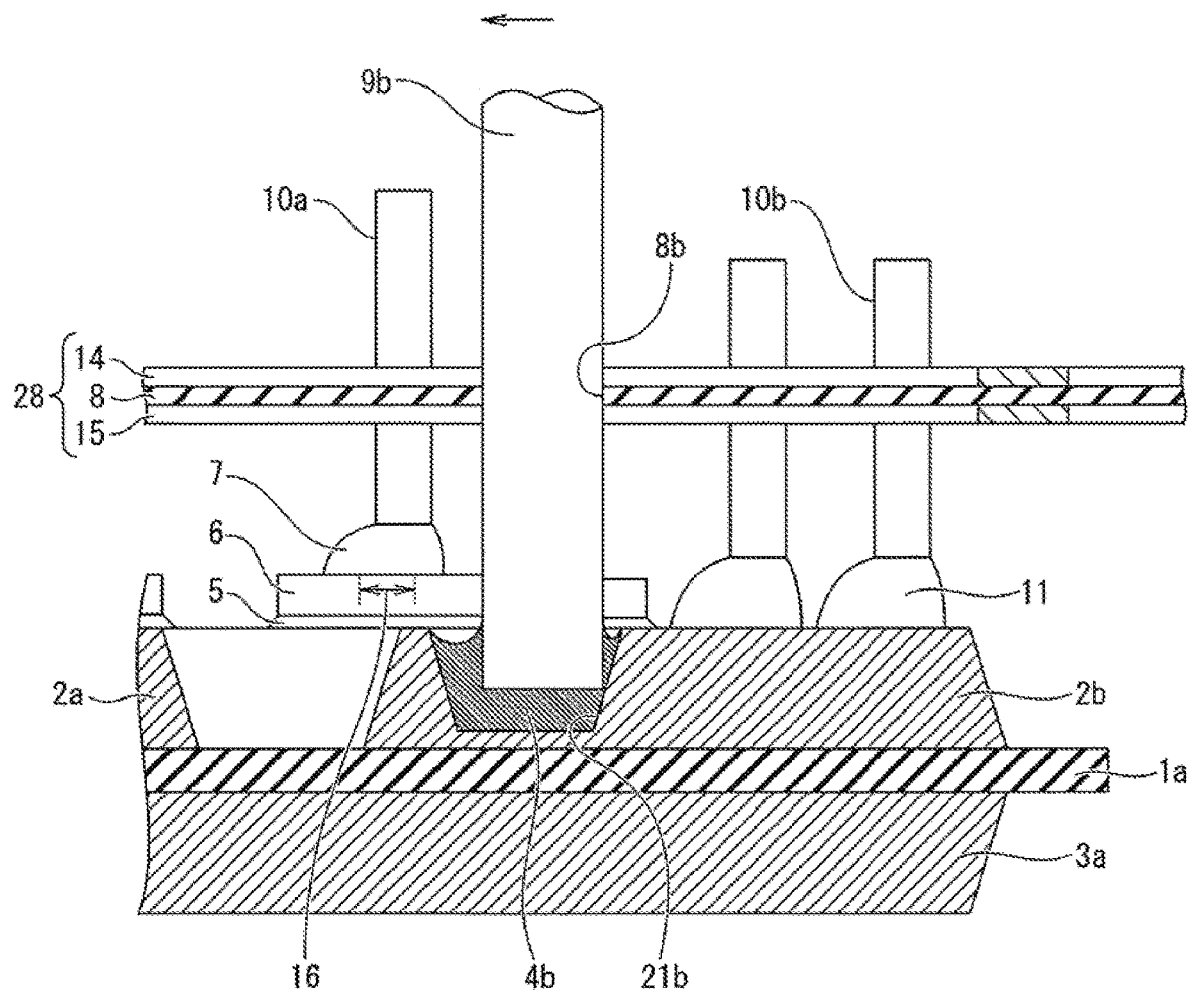
FIG. 19 is a cross-sectional view schematically illustrating a partially enlarged view of an area surrounding an external terminal in a (tenth) step in the method of manufacturing a semiconductor device according to the embodiment of the present invention.

Next, the first bonding material 4a and 4b, the second bonding material 5, and the third bonding material 7 are simultaneously heated and liquefied. Here, as illustrated in FIG. 19, the bonding positions of the semiconductor chip 6 and the first implant pin 10a sometimes do not sufficiently overlap with a prescribed optimal bonding position 16. More specifically, during formation of the terminal through hole for supporting the external terminal 9b in the printed circuit board 28 (8, 14, 15), for example, the position of the terminal through hole sometimes gets shifted slightly away from the design position due to vibration of the processing equipment, a tilt in a support device that supports the printed circuit board 28 (8, 14, 15) during processing, or the like. Moreover, when the recesses are formed by etching the metal layers of the insulated circuit boards, the positions of the recesses similarly sometimes get shifted slightly away from the design positions.

As illustrated in FIG. 19, the first bonding material 4b, the third bonding material 7, and the metal layer-pin bonding material 11 are all heated and liquefied, which causes liquidity to increase. As a result, the external terminal 9b becomes capable of moving within the space inside the recess 21b. Similarly, the first implant pin 10a and the second implant pin 10b supported together with the external terminal 9b by the printed circuit board 28 (8, 14, 15) also become capable of moving horizontally within the range of possible movement of the external terminal 9b.

Figure 20:
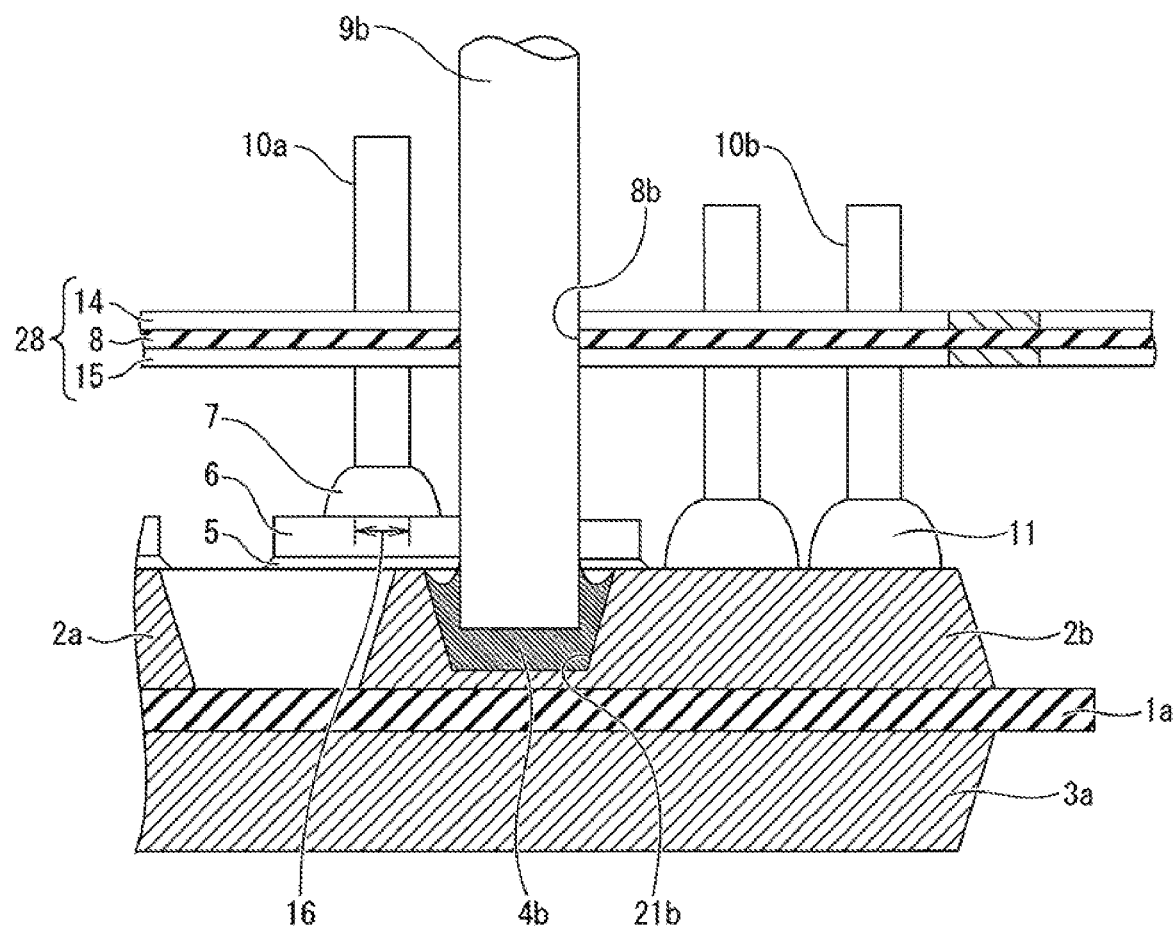
FIG. 20 is a cross-sectional view schematically illustrating a partially enlarged view of the area surrounding the external terminal in an (eleventh) step in the method of manufacturing a semiconductor device according to the embodiment of the present invention.

In the liquefied first bonding material 4b, third bonding material 7, and metal layer-pin bonding material 11, surface tension effects arise. Thus, as illustrated in FIG. 20, the first implant pin 10a moves slightly closer to the semiconductor chip 6. In other words, the spacing (relative positioning) between the semiconductor chip 6 and the first implant pin 10a is adjusted in a self-correcting manner so as to be minimized.

If the melting point of the second bonding material 5 is less than or equal to the melting point of the first bonding material 4b, the third bonding material 7, and the metal layer-pin bonding material 11, the second bonding material 5 is also liquefied at this time. As a result, not only the first implant pin 10a but also the semiconductor chip 6 becomes capable of moving in the horizontal direction. Therefore, the mutual movement of the semiconductor chip 6 and the first implant pin 10a further enhances the self-correcting adjustment of the relative positioning.

Figure 21:
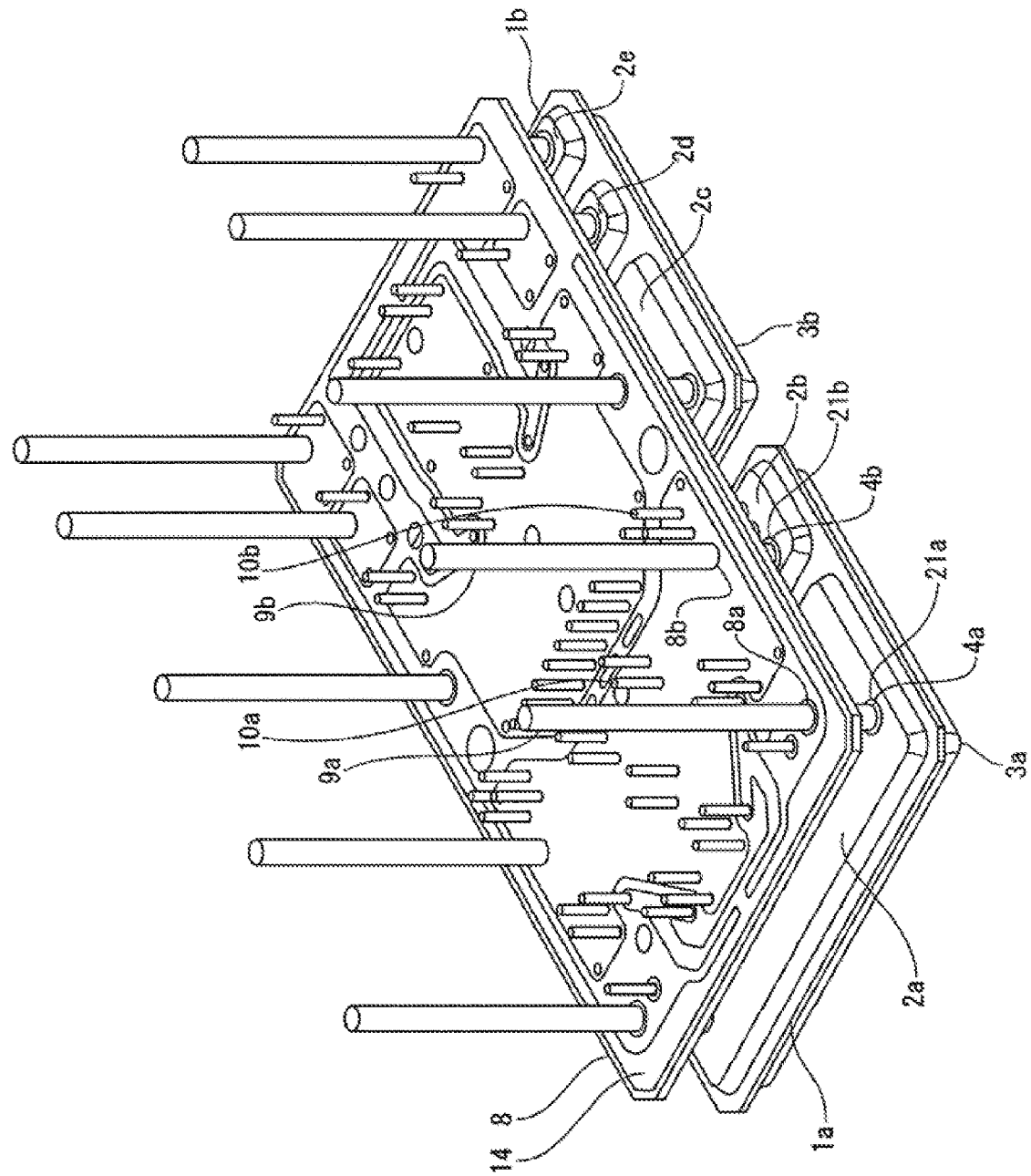
FIG. 21 is a perspective view schematically illustrating a (twelfth) step in the method of manufacturing a semiconductor device according to the embodiment of the present invention.

Next, as illustrated in FIG. 21, the first bonding material 4a and 4b, the second bonding material, the third bonding material, and the metal layer-pin bonding material are cooled and hardened, thereby completing integration of the implant printed circuit board and the two insulated circuit boards. Then, the areas surrounding the semiconductor modules illustrated in FIG. 21 are sealed with an insulating material such as a resin, thereby making it possible to manufacture the semiconductor device illustrated in FIG. 1.

In the method of manufacturing the semiconductor device according to this embodiment of the present invention, the external terminals are directly and firmly supported by the terminal through holes in the printed circuit board without any solder or the like interposed therebetween. Therefore, during assembly of the implant printed circuit board and the insulated circuit boards, there is no burden associated with soldering processes or the like, which yields excellent manufacturability. Moreover, the increased resistance of the device to stresses applied to bonding portions during assembly makes it possible to manufacture the device easily.

Furthermore, the semiconductor device according to this embodiment of the present invention has a heat radiating base-less structure in which the bottom surfaces of the heat sink plates are exposed. Therefore, when integrally molding the semiconductor device by means of transfer molding or the like, the bottom surfaces of the exposed heat sink plates and the upper ends of the external terminals positioned on the side opposite to the heat sink plates must both be brought into contact with and have force applied thereto by respective support devices so as to fix the semiconductor modules in place by the pressure sandwiching the semiconductor modules from above and below. In the method of manufacturing according to this embodiment of the present invention, the external terminals, the printed circuit board, and the insulated circuit boards are integrated together strongly, thereby yielding high resistance even against stresses applied during such integral molding.

In addition, in the method of manufacturing the semiconductor device according to this embodiment of the present invention, performing the etching for forming the primary metal layers and the auxiliary metal layers and the etching for forming the recesses in two separate stages makes it possible to form the recesses with the further improved precision of the shape and dimensions of the recesses.

Moreover, in the method of manufacturing the semiconductor device according to this embodiment of the present invention, the width of the openings of the recesses is equal to the maximum width of the external terminals at the height of the openings plus the positional shift margin that is set to not less than 0.5 mm and not more than 3 mm, thereby creating space between the openings and the external terminals. This makes it possible to accommodate positional shifts even when the plurality of external terminals are inserted into the respectively corresponding plurality of recesses all at once, thereby making it possible to assemble the semiconductor device efficiently.

Furthermore, in regards to the positions of the terminal through holes in the printed circuit board (that is, the absolute positions of the external terminals in the printed circuit board), even when the actual positions get shifted relative to the design positions, the spaces in the recesses accommodate these shifts. This eliminates the need for a high-precision positioning process in which the external terminals are stood up on the metal layers one by one while determining the relative positions in accordance with prescribed values.

In addition, in the method of manufacturing the semiconductor device according to this embodiment of the present invention, in the recesses, the width of the openings of the recesses is greater than the width of the bottoms, and therefore the corners of the edges of the openings have an obtuse-angled cross-sectional shape. Thus, even if the first bonding material filled into the recesses does not reach the edges of the openings and the corners of the edges are exposed, these edges do not protrude out inside the semiconductor modules. This inhibits air bubbles from forming around the edges when sealing the semiconductor modules with resin to integrally mold the semiconductor device, thereby making it possible to prevent deterioration in the quality of the semiconductor device.

Moreover, in the method of manufacturing the semiconductor device according to this embodiment of the present invention, forming the plurality of recesses using etching makes it possible to manufacture the device more quickly, efficiently, and inexpensively than when using machining processes, which incur burdens associated with positioning and controlling punching strength and the like. Moreover, bonding members such as sleeves are not required, which makes it possible to avoid increases in the overall number of components.

Furthermore, in the method of manufacturing the semiconductor device according to this embodiment of the present invention, the first bonding material, the second bonding material, and the third bonding material are simultaneously liquefied in a state in which all of the external terminals, first implant pins, and second implant pins are supported by the printed circuit board. This liquefaction is used to respectively impart mobility to the external terminals, the semiconductor chips, and the first implant pins. Therefore, the relative positioning between the semiconductor chips and the first implant pins and second implant pins is adjusted in a self-correcting manner, and the bonding positions can be optimized.

Modification Example 1

Figure 22:
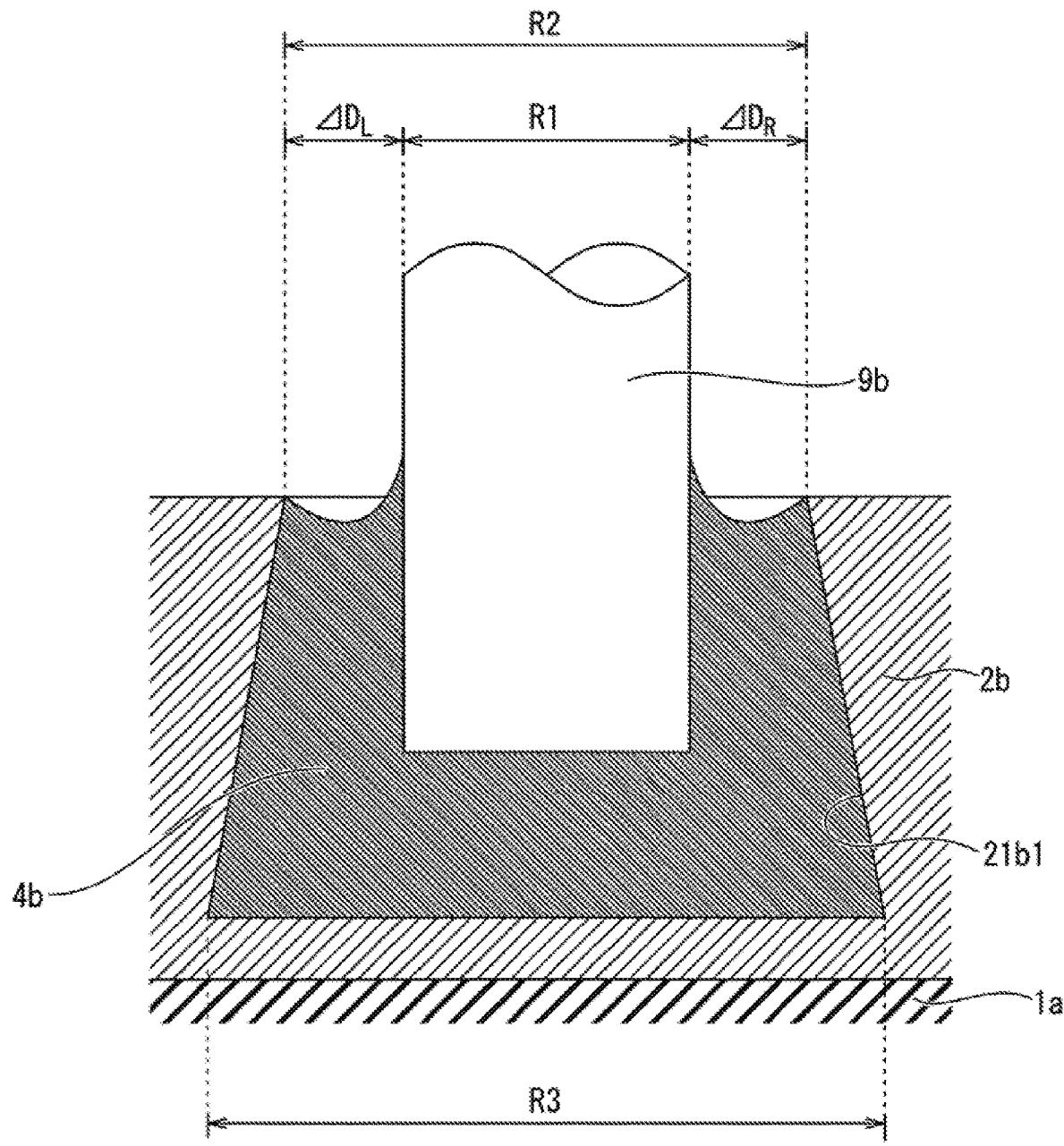
FIG. 22 is a cross-sectional view schematically illustrating a partially enlarged view of a connected portion of an external terminal and an insulated circuit board in a semiconductor device according to Modification Example 1 of the embodiment of the present invention.

As illustrated in FIG. 5, the recesses formed in the metal layers of the insulated circuit boards of the semiconductor device according to the embodiment of the present invention have a shape in which the slanted surfaces of the sidewalls become narrower moving downwards (a tapered shape). However, as illustrated in FIG. 22, in a semiconductor device according to Modification Example 1 of the present invention, a recess 21b1 may have a reverse-tapered shape in which the slanted surfaces of the sidewalls become wider moving downwards and the width R3 of the bottom is greater than the width R2 of the opening. As long as the prescribed positional shift margin ($\Delta D_L + \Delta D_R$) is added to the maximum width R1 of the external terminal 9b at the height of the opening, the width R2 of the opening of the recess 21b1 may be less than the width R3 of the bottom. The recess 21b1 in the semiconductor device according to Modification Example 1 can be formed by performing an etching process that controls the depth and the width in the horizontal direction, or the like.

However, in consideration of cases in which the first bonding material does not reach the edges of the openings of the recesses and the corners of the edges are exposed, it is preferable that a process for inhibiting formation of air bubbles (such as adjusting the injection amount or injection rate of resin) be performed during integral molding of the semiconductor device. Other configurations of the semiconductor device according to Modification Example 1 are equivalent to those in the semiconductor device described with reference to FIGS. 1 to 21.

The semiconductor device according to Modification Example 1 similarly offers increased bond strength between the insulated circuit boards, the external terminals, and the printed circuit board and also makes it possible to provide a semiconductor device with excellent manufacturability. Other advantageous effects of the semiconductor device according to Modification Example 1 are the same as in the semiconductor device described with reference to FIGS. 1 to 21.

Modification Example 2

Figure 23:
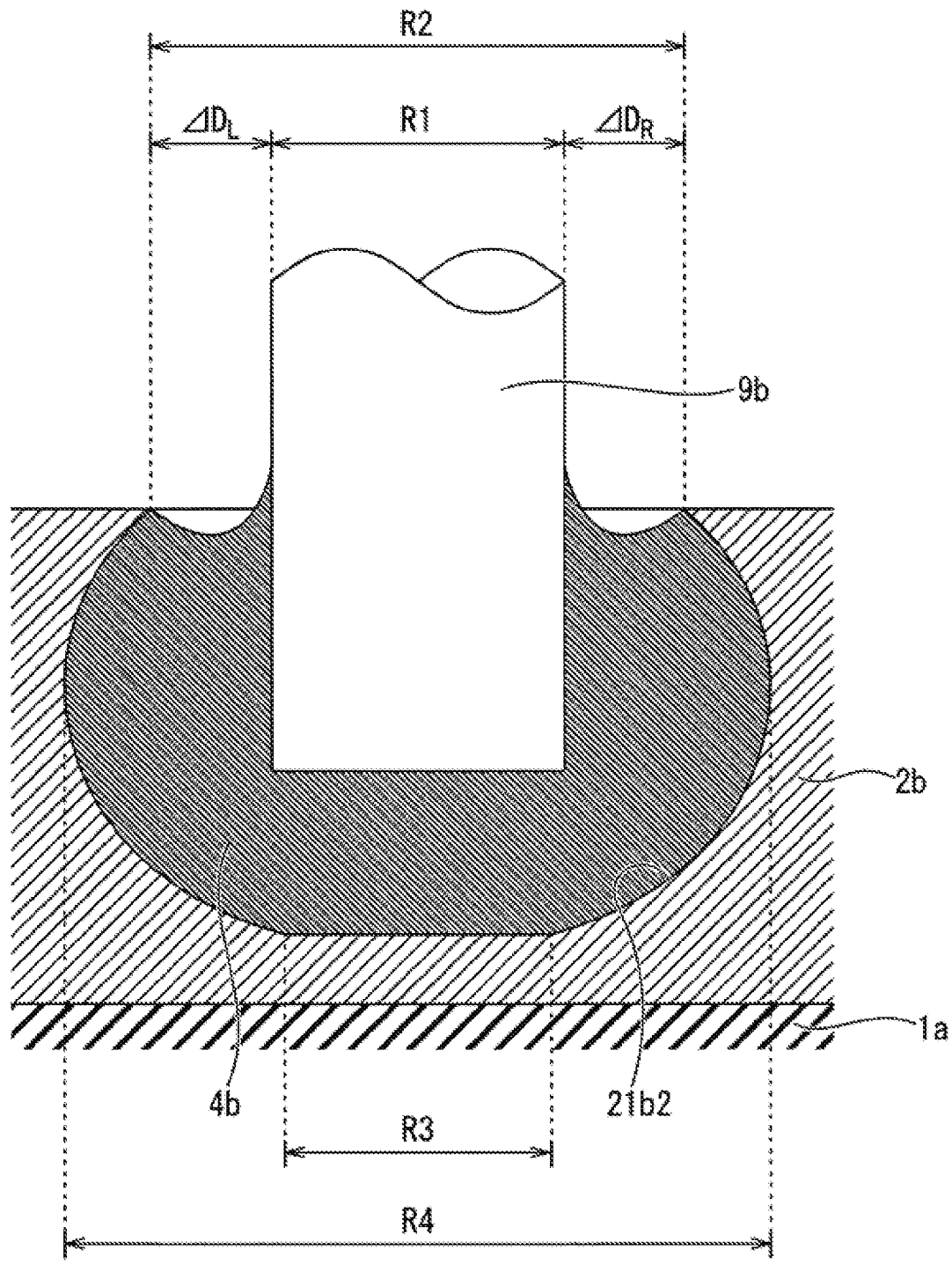
FIG. 23 is a cross-sectional view schematically illustrating a partially enlarged view of a connected portion of an external terminal and an insulated circuit board in a semiconductor device according to Modification Example 2 of the embodiment of the present invention.

As illustrated in FIG. 23, a recess 21b2 in which the sidewalls have a slanted surface may have a cross-sectional shape in which a width R4 at the center in the depth direction is greater than the width R2 of the opening and the width R3 of the bottom. As long as the prescribed positional shift margin ($\Delta D_L + \Delta D_R$) is added to the maximum width R1 of the external terminal 9b at the height of the opening, the recess 21b2 may have a spherical shape. The recess 21b2 of the semiconductor device according to Modification Example 2 of the present invention can similarly be formed using etching or the like. Other configurations of the semiconductor device according to Modification Example 2 are equivalent to those in the semiconductor device described with reference to FIGS. 1 to 21.

The semiconductor device according to Modification Example 2 similarly offers increased bond strength between the insulated circuit boards, the external terminals, and the printed circuit board and also makes it possible to provide a semiconductor device with excellent manufacturability. Other advantageous effects of the semiconductor device according to Modification Example 2 are the same as in the semiconductor device described with reference to FIGS. 1 to 21.

Modification Example 3

Figure 24:
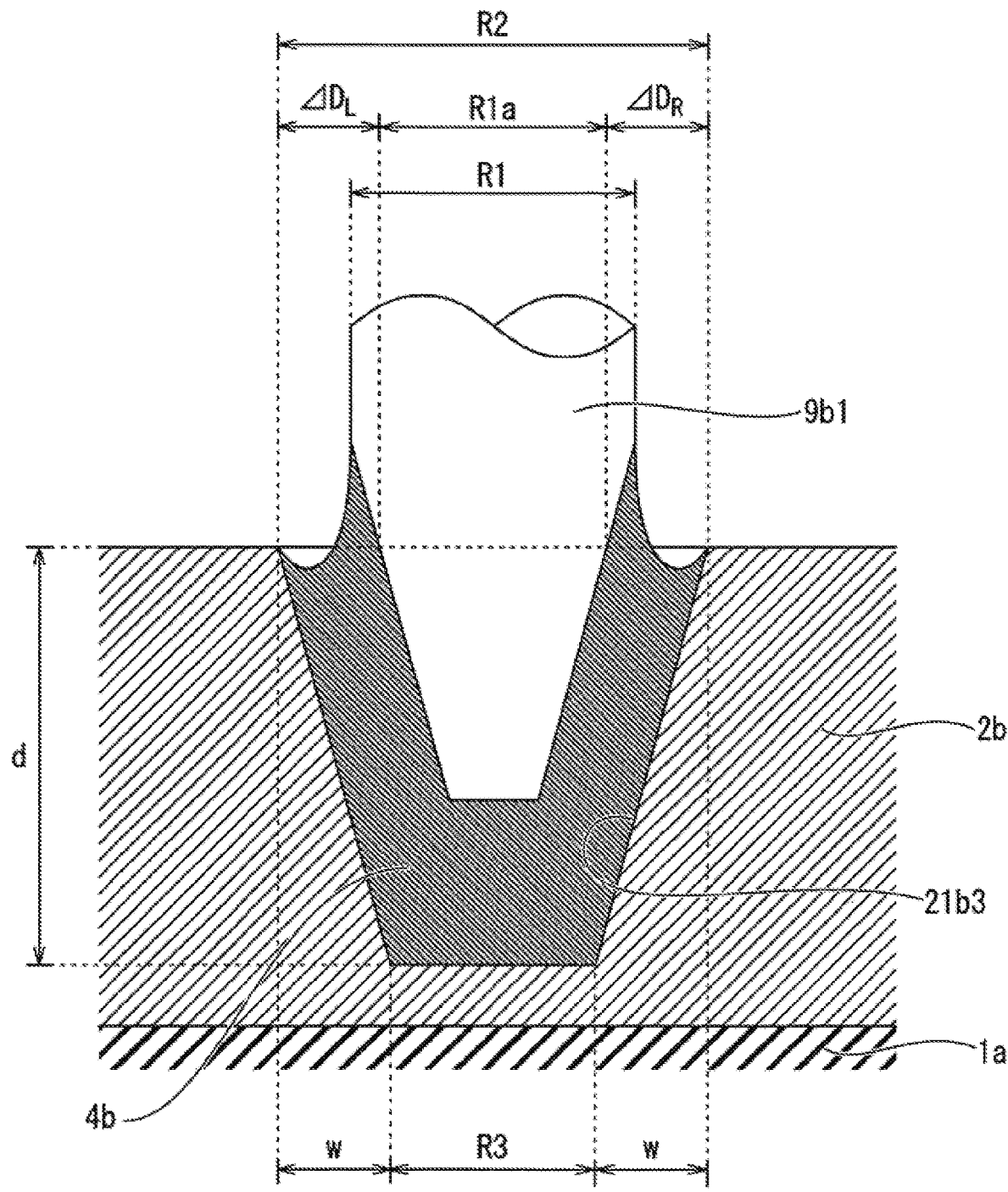
FIG. 24 is a cross-sectional view schematically illustrating a partially enlarged view of a connected portion of an external terminal and an insulated circuit board in a semiconductor device according to Modification Example 3 of the embodiment of the present invention.

As illustrated in FIG. 24, the bottom end of an external terminal 9b1 may have a shape which becomes narrower moving towards the auxiliary metal layer 2b (a tapered shape). In a recess 21b3 in a semiconductor device according to Modification Example 3 of the present invention, the width R2 of the opening is equal to the maximum width R1a of the external terminal 9b1 at the height of the opening plus the positional shift margin ($\Delta D_L + \Delta D_R$). Moreover, as illustrated in FIG. 24, the width w and depth d of the slanted surfaces of the sidewalls satisfy a ratio of 0.3:1.0. Other configurations of the semiconductor device according to Modification Example 3 are equivalent to those in the semiconductor device described with reference to FIGS. 1 to 21.

The semiconductor device according to Modification Example 3 similarly offers increased bond strength between the insulated circuit boards, the external terminals, and the printed circuit board and also makes it possible to provide a semiconductor device with excellent manufacturability. Moreover, reducing the diameter of the bottom ends of the external terminals at the height of the openings and also reducing the diameter of the recesses further reduces the area of the primary metal layers and the auxiliary metal layers and makes it possible to miniaturize the semiconductor device. Furthermore, the width of the bottom ends of the external terminals 9a and 9b is less than the width of the regions above the bottom ends, which makes it easy to insert the external terminals 9a and 9b into the terminal through holes 8a and 8b in the printed circuit board 28 (8, 14, 15). Other advantageous effects of the semiconductor device according to Modification Example 3 are the same as in the semiconductor device described with reference to FIGS. 1 to 21.

Modification Example 4

Figure 25A:
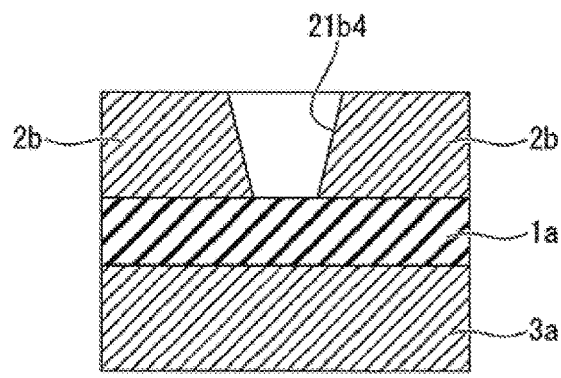
FIG. 25A is a cross-sectional view schematically illustrating a partially enlarged view of a connected portion of an external terminal and an insulated circuit board in a semiconductor device according to Modification Example 4 of the embodiment of the present invention.

The bottom of the recess 21b illustrated in FIG. 5 is the upper surface of the auxiliary metal layer 2b, which is thinner than in the areas surrounding the recess 21b. However, as illustrated in FIG. 25A, the metal layer 2b may be completely removed inside a recess 21b4 such that the bottom is the upper surface of the insulating board 1a. In regards to this recess 21b4 in a semiconductor device according to Modification Example 4 of the present invention, by etching the circuit pattern and etching the recesses into the insulated circuit board of a DCB substrate at the same time, for example, the recess 21b4 can be formed to have a depth equal to the depth of the trenches in the circuit pattern.

In the method of manufacturing the semiconductor device according to the embodiment of the present invention as described with reference to FIGS. 9 to 14, the etching for forming the primary metal layer 2a and the auxiliary metal layer 2b and the etching for forming the recesses 21a and 21b are performed in two separate stages. However, similar to here in Modification Example 4, the etching for forming the primary metal layer 2a and the auxiliary metal layer 2b and the etching for forming the recesses 21a and 21b may be performed at the same time.

In other words, after the state illustrated in FIGS. 9 and 10, the state illustrated in FIGS. 11 and 12 is skipped, and the method proceeds to the state illustrated in FIGS. 13 and 14. However, the insulating board 1a exhibits poor bond strength with the first bonding material such as solder, and therefore in consideration of bond strength, it is preferable that a layer with excellent bond strength similar to the portion of the auxiliary metal layer 2b illustrated in FIG. 5 be deposited. Other configurations of the semiconductor device according to Modification Example 4 are equivalent to those in the semiconductor device described with reference to FIGS. 1 to 21.

The semiconductor device according to Modification Example 4 similarly offers increased bond strength between the insulated circuit boards, the external terminals, and the printed circuit board and also makes it possible to provide a semiconductor device with excellent manufacturability. Other advantageous effects of the semiconductor device according to Modification Example 4 are the same as in the semiconductor device described with reference to FIGS. 1 to 21.

Modification Example 5

Figure 25B:
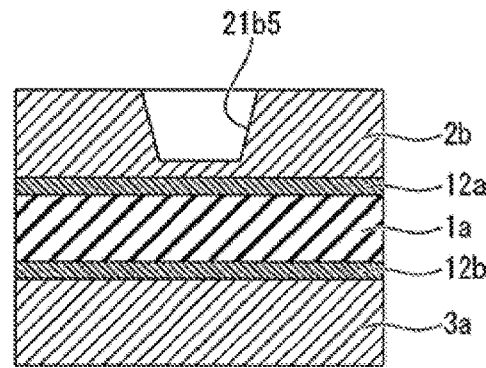
FIG. 25B is a cross-sectional view schematically illustrating a partially enlarged view of a connected portion of an external terminal and an insulated circuit board in a semiconductor device according to Modification Example 5 of the embodiment of the present invention.

Furthermore, AMB substrates or the like in which a bonding layer made primarily of a silver (Ag) brazing material or the like is interposed between the insulating board and the metal layer may be used as the insulated circuit boards. FIG. 25B depicts an example of an insulated circuit board in which an upper bonding layer 12a is formed between the insulating board 1a and the auxiliary metal layer 2b on the upper side and a lower bonding layer 12b is formed between the insulating board 1a and the heat sink plate 3a on the lower side. A recess 21b5 can be formed by performing, on the AMB substrate or the like, an etching process in which depth is controlled such that the auxiliary metal layer 2b is left remaining thinner beneath the bottom of the recess 21b5 than in the areas surrounding the recess 21b5. Other configurations of a semiconductor device according to Modification Example 5 of the present invention are equivalent to those in the semiconductor device described with reference to FIGS. 1 to 21.

The semiconductor device according to Modification Example 5, in which insulated circuit boards having a bonding layer interposed between the insulating board and the metal layer are used, similarly offers increased bond strength between the insulated circuit boards, the external terminals, and the printed circuit board and also makes it possible to provide a semiconductor device with excellent manufacturability. Other advantageous effects of the semiconductor device according to Modification Example 5 are the same as in the semiconductor device described with reference to FIGS. 1 to 21.

Modification Example 6

Figure 25C:
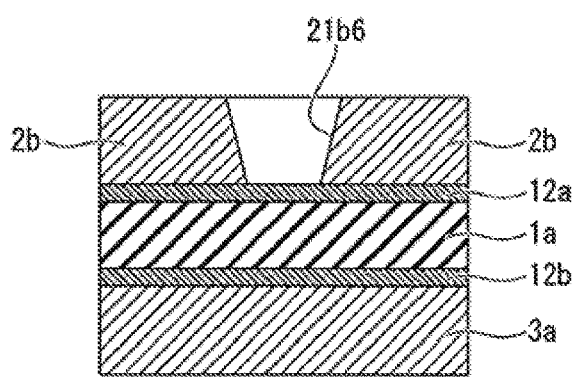
FIG. 25C is a cross-sectional view schematically illustrating a partially enlarged view of a connected portion of an external terminal and an insulated circuit board in a semiconductor device according to Modification Example 6 of the embodiment of the present invention.

In addition, in a semiconductor device in which insulated circuit boards having a bonding layer are used, the bottoms of the recesses may be the upper surface of the bonding layer, similar to in the recess 21b4 in the semiconductor device according to Modification Example 4 and illustrated in FIG. 25A. As illustrated in FIG. 25C, in a semiconductor device according to Modification Example 6 of the present invention that uses an insulated circuit board having an upper bonding layer 12a and a lower bonding layer 12b, the bottom of a recess 21b6 is the upper surface of the upper bonding layer 12a.

The recess 21b6 can be formed by preparing an AMB substrate or the like having a bonding layer as the insulated circuit board, similar to in Modification Example 5, and then etching the insulated circuit board until the upper surface of the upper bonding layer 12a is exposed. Alternatively, a metal layer in which circuit patterns and the recess 21b6 are patterned in advance using a machining process or screen printing or the like may be prepared, and then this metal layer may be affixed to the upper surface of an insulating board via a bonding layer such as the upper bonding layer 12a. Other configurations of the semiconductor device according to Modification Example 6 are equivalent to those in the semiconductor device described with reference to FIGS. 1 to 21.

The semiconductor device according to Modification Example 6 similarly offers increased bond strength between the insulated circuit boards, the external terminals, and the printed circuit board and also makes it possible to provide a semiconductor device with excellent manufacturability. Other advantageous effects of the semiconductor device according to Modification Example 6 are the same as in the semiconductor device described with reference to FIGS. 1 to 21.

Modification Example 7

Figure 25D:
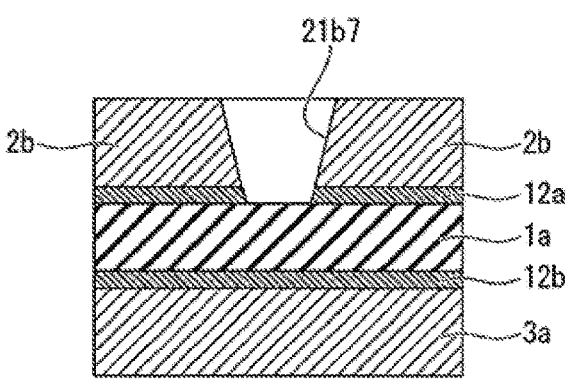
FIG. 25D is a cross-sectional view schematically illustrating a partially enlarged view of a connected portion of an external terminal and an insulated circuit board in a semiconductor device according to Modification Example 7 of the embodiment of the present invention.

In addition, in a semiconductor device in which insulated circuit boards having a bonding layer are used, the bottoms of the recesses may be the upper surface of the insulating board, similar to in the recess 21b4 in the semiconductor device according to Modification Example 4 and illustrated in FIG. 25A. As illustrated in FIG. 25D, in a semiconductor device according to Modification Example 7 of the present invention that uses an insulated circuit board having an upper bonding layer 12a and a lower bonding layer 12b, the bottom of a recess 21b7 is the upper surface of the insulating board 1a.

The recess 21b7 can be formed by preparing an AMB substrate or the like having a bonding layer as the insulated circuit board, similar to in Modification Example 5, and then etching the insulated circuit board until the upper surface of the insulating board 1a is exposed. Alternatively, a metal layer in which circuit patterns and the recess 21b7 are patterned in advance using a machining process or screen printing or the like may be prepared, and then this metal layer may be affixed to the upper surface of the insulating board via a bonding layer such as the upper bonding layer 12a which is patterned such that the recess 21b7 is exposed. Other configurations of the semiconductor device according to Modification Example 7 are equivalent to those in the semiconductor device described with reference to FIGS. 1 to 21.

—Other Embodiments—

Although the present invention was described with reference to the embodiments above, the descriptions or drawings of this disclosure should not be understood to limit the present invention in any way. It should instead be understood that various alternative embodiments, examples, and applied technologies would be obvious to a person skilled in the art based on this disclosure.

For example, the melting point of the second bonding material may be higher than the melting point of the first bonding material and the third bonding material. When the melting point of the second bonding material is higher than the melting point of the first bonding material and the third bonding material, the second bonding material will remain in a solid state when the first bonding material and the third bonding material are simultaneously liquefied. In other words, after the semiconductor chips are first mounted on and bonded to the primary metal layer of the insulated circuit board, only the first implant pins will become capable of moving, while the positions of the semiconductor chips will remain fixed. Even when the relative positioning between the semiconductor chips and the first implant pins is adjusted in a self-correcting manner only by movement of the first implant pins, the advantageous effects of the present invention can still be achieved.

Moreover, as described with reference to FIGS. 15 to 18, in the method of manufacturing the semiconductor device according to the embodiment of the present invention, after first inserting the first bonding material into the recesses, the external terminals supported by the implant printed circuit board are inserted into the recesses from the upper side, and the external terminals and first bonding material are brought into contact. However, the method of manufacturing a semiconductor device according to the present invention is not limited to this example, and after completing preparation of the implant printed circuit board, the first bonding material such as solder can be affixed to the bottom ends of the external terminals supported by the implant printed circuit board instead of inserting the first bonding material into the recesses. Then, the bottom ends of the external terminals having the first bonding material affixed thereto may be inserted into the recesses, and the implant printed circuit board and insulated circuit boards may be integrated together.

In addition, the semiconductor device structures illustrated in FIGS. 1 to 25 can be partially combined to achieve a semiconductor device according to the present invention. As described above, the present invention includes various other embodiments and the like that are not explicitly described above, and the technical scope of the present invention is defined only by the characterizing features of the invention as set forth in the claims, which are appropriately derived from the descriptions above.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a bottom circuit board that includes an insulating board having an upper surface and a metal layer on the upper surface of the insulating board, the metal layer having a recess in an upper surface thereof;
   a rod-shaped external terminal having a top end to be connected to an external device and a bottom end inserted into the recess in the metal layer of the bottom circuit board, the bottom end having a width narrower than a width of an opening of the recess;
   a printed circuit board that directly supports the external terminal at an intermediate portion thereof between the top end and the bottom end so that the printed circuit board is disposed over the bottom circuit board in parallel with the bottom circuit board; and
   a first bonding material that is arranged inside the recess and conductively connects together the bottom end of the external terminal and the metal layer.

2. The semiconductor device according to claim 1, further comprising:
   a second bonding material arranged on the metal layer;
   a semiconductor chip arranged on the second bonding material;
   a pin supported by the printed circuit board; and a third bonding material arranged between the semiconductor chip and the pin to connect the semiconductor chip to the pin.

3. The semiconductor device according to claim 2, wherein a melting point of the second bonding material is greater than or equal to a melting point of the first bonding material and a melting point of the third bonding material.

4. The semiconductor device according to claim 1, wherein the width of the opening of the recess is equal to a maximum width of the external terminal at a height of the opening plus a positional shift margin that is set to not less than 0.5 mm and not more than 3 mm.

5. The semiconductor device according to claim 1, wherein a bottom of the recess is the metal layer and does not expose the insulating board underneath.

6. The semiconductor device according to claim 1, wherein the bottom circuit board further includes a bonding layer interposed between the metal layer and the insulating board, and a bottom of the recess exposes the bonding layer.

7. The semiconductor device according to claim 1, wherein a bottom of the recess exposes the insulating board underneath.

8. The semiconductor device according claim 1, wherein a sidewall of the recess has a slanted surface.

9. The semiconductor device according to claim 8, wherein the width of the opening of the recess is greater than a width of a bottom of the recess.

10. The semiconductor device according to claim 9, wherein a ratio of a horizontal displacement of the slanted surface to a vertical displacement of the slanted surface of the recess is 0.3:1.0.

11. The semiconductor device according to claim 9, wherein a width of the recess at a middle depth of the recess is greater than the width of the opening and the width of the bottom of the recess.

12. The semiconductor device according to claim 1, wherein the bottom end of the external terminal has a downward tapered shape having a progressively narrow width.

13. A method of manufacturing a semiconductor device, comprising:
preparing a printed circuit board that directly supports a rod-shaped external terminal at an intermediate portion of the external terminal between a top end and a bottom end of the external terminal;
preparing a bottom circuit board that includes an insulating board having an upper surface and a metal layer on the upper surface of the insulating board, the metal layer having a recess in an upper surface thereof, and an opening of the recess being larger than a width of the bottom end of the external terminal;
putting a first bonding material inside the recess or on the bottom end of the external terminal;
moving the printed circuit board towards the bottom circuit board so as to bring the bottom end of the external terminal inside the recess with the first bonding material being inside the recess; and
liquefying the first bonding material in the recess to fix the bottom end of the external terminal to the recess via the first bonding material so that the printed circuit board is disposed over the bottom circuit board in parallel with the bottom circuit board.

14. The method of manufacturing a semiconductor device according to claim 13,
wherein the step of preparing the printed circuit board includes installing the external terminal and a pin in the printed circuit board,
wherein the method further comprises:
prior to the step of moving the printed circuit board towards the bottom circuit board, mounting a semiconductor chip on the metal layer via a second bonding material; and
thereafter, arranging a third bonding material on the semiconductor chip,
wherein the step of moving the printed circuit board towards the bottom circuit board includes bringing the pin into contact with the third bonding material, and
wherein the step of liquefying the first bonding material simultaneously liquefies the third bonding material such that relative positioning of the semiconductor chip and the pin is adjusted in a self-correcting manner.

15. The method of manufacturing a semiconductor device according to claim 14, wherein during the step of liquefying the first bonding material, the second bonding material maintains a solid state.

16. The method of manufacturing a semiconductor device according to claim 14, wherein the step of liquefying the first bonding material simultaneously liquefies the second bonding material as well as the third bonding material.

17. The method of manufacturing a semiconductor device according to claim 13, wherein the width the opening of the recess is set to a maximum width of the external terminal at a height of the opening of the recess when the external terminal is inserted into the recess plus a positional shift margin that is set to not less than 0.5 mm and not more than 3 mm.

18. The method of manufacturing a semiconductor device according to claim 14, wherein the step of preparing the bottom circuit board includes an etching process that forms the recess in the metal layer and another separate etching process that forms a circuit pattern in the metal layer.

19. The method of manufacturing a semiconductor device according to claims 14, wherein the step of preparing the bottom circuit board includes a single etching process that forms the recess and a circuit pattern in the metal layer simultaneously.

* * * * *